US011581331B2

United States Patent
Ryu et al.

(10) Patent No.: US 11,581,331 B2
(45) Date of Patent: Feb. 14, 2023

(54) SEMICONDUCTOR MEMORY DEVICE AND METHOD OF FABRICATING THE SAME

(71) Applicant: SAMSUNG ELECTRONICS CO., LTD., Suwon-si (KR)

(72) Inventors: Hyo Joon Ryu, Hwaseong-si (KR); Young Hwan Son, Hwaseong-si (KR); Seo-Goo Kang, Seoul (KR); Jung Hoon Jun, Hwaseong-si (KR); Kohji Kanamori, Seongnam-si (KR); Jee Hoon Han, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 164 days.

(21) Appl. No.: 17/101,401

(22) Filed: Nov. 23, 2020

(65) Prior Publication Data

US 2021/0313344 A1    Oct. 7, 2021

(30) Foreign Application Priority Data

Apr. 6, 2020 (KR) .................... 10-2020-0041461

(51) Int. Cl.
| | |
|---|---|
| *H01L 27/11582* | (2017.01) |
| *H01L 23/535* | (2006.01) |
| *H01L 27/11573* | (2017.01) |
| *H01L 27/11529* | (2017.01) |
| *H01L 27/11556* | (2017.01) |

(52) U.S. Cl.
CPC ...... *H01L 27/11582* (2013.01); *H01L 23/535* (2013.01); *H01L 27/11529* (2013.01); *H01L 27/11556* (2013.01); *H01L 27/11573* (2013.01)

(58) Field of Classification Search
None
See application file for complete search history.

(56) References Cited

U.S. PATENT DOCUMENTS

| | | | |
|---|---|---|---|
| 9,691,782 B1 | 6/2017 | Hwang et al. | |
| 9,728,266 B1 | 8/2017 | Goda et al. | |
| 10,290,650 B1 | 5/2019 | Iwai | |
| 10,297,610 B2 | 5/2019 | Kai et al. | |
| 10,381,450 B1 | 8/2019 | Yada et al. | |
| 2016/0329340 A1 | 11/2016 | Hwang et al. | |
| 2017/0287928 A1 | 10/2017 | Kanamori et al. | |
| 2021/0028184 A1* | 1/2021 | Kim | H01L 27/11582 |
| 2021/0288067 A1* | 9/2021 | Kanamori | H01L 27/11526 |

* cited by examiner

*Primary Examiner* — Hsien Ming Lee
(74) *Attorney, Agent, or Firm* — Lee IP Law, P.C.

(57) ABSTRACT

A semiconductor memory includes metallic lines on a substrate and including an uppermost metallic line, a semiconductor conduction line on the uppermost metallic line, a vertical structure penetrating the semiconductor conduction line and metallic lines, and including a vertical structure that includes an upper channel film, a first lower channel film, and an upper connection channel film connecting the upper channel film and the first lower channel film between a bottom of the semiconductor conduction line and a bottom of the uppermost metallic line, and a first cutting line through the metallic lines and the semiconductor conduction line, and including a first upper cutting line through the semiconductor conduction line, and a first lower cutting line through the plurality of metallic lines, a width of the first upper cutting line being greater than a width of an extension line of a sidewall of the first lower cutting line.

20 Claims, 36 Drawing Sheets

SEMICONDUCTOR MEMORY DEVICE AND METHOD OF FABRICATING THE SAME

CROSS-REFERENCE TO RELATED APPLICATION

Korean Patent Application No. 10-2020-0041461, filed on Apr. 6, 2020, in the Korean Intellectual Property Office, and entitled: "Semiconductor Memory Device and Method of Fabricating the Same," is incorporated by reference herein in its entirety.

BACKGROUND

1. Field

Embodiments relate to a semiconductor memory device and a method of fabricating the same, and more particularly, to a three-dimensional semiconductor memory device including a vertical channel structure, and a method of fabricating the same.

2. Description of the Related Art

In order to satisfy excellent performance and low price desired by consumers, it is required to increase a degree of integration of a semiconductor device. For example, in the case of a two-dimensional or planar semiconductor device, since the degree of integration is mainly determined by an area occupied by unit memory cells, it is greatly affected by the level of fine pattern formation technique. However, since ultra-expensive apparatuses are required for the miniaturization of patterns, and the degree of integration of the two-dimensional semiconductor device is limited, a three-dimensional semiconductor memory device equipped with memory cells arranged three-dimensionally has been proposed.

SUMMARY

According to an aspect of the present disclosure, there is provided a semiconductor memory device including a stacked structure including a plurality of metallic lines stacked in a first direction, on a substrate, a semiconductor conduction line formed of a semiconductor material, on the stacked structure, a vertical structure penetrating the semiconductor conduction line and the stacked structure, and including a channel film and a first cutting line which cuts the plurality of metallic lines and the semiconductor conduction line, wherein the channel film includes an upper channel film and a first lower channel film extending in the first direction, and an upper connection channel film which connects the upper channel film and the first lower channel film and extends in a second direction different from the first direction, the plurality of metallic lines includes an uppermost metallic line which is closest to the semiconductor conduction line, between a lower surface of the semiconductor conduction line and a lower surface of the uppermost metallic line, the upper connection channel film is connected to the upper channel film and the first lower channel film, the first cutting line includes a first upper cutting line which cuts the semiconductor conduction line, and a first lower cutting line which cuts the plurality of metallic lines, and on the lower surface of the semiconductor conduction line, a width of the first upper cutting line is greater than a width of an extension line of sidewall of the first lower cutting line.

According to another aspect of the present disclosure, there is provided a semiconductor memory device including a stacked structure including a plurality of metallic lines stacked in a first direction, on a substrate, a semiconductor conduction line formed of a semiconductor material, on the stacked structure, a vertical structure penetrating the semiconductor conduction line and the stacked structure, and including a channel film and a vertical insulation pattern, the vertical insulation pattern filling a space defined by the channel film and a cutting line which cuts the plurality of metallic lines and the semiconductor conduction line, wherein the plurality of metallic lines includes an uppermost metallic line which is closest to the semiconductor conduction line, the channel film includes an upper channel film extending in the first direction and placed in the semiconductor conduction line, and a lower channel film extending in the first direction and placed in the stacked structure, the upper channel film and the lower channel film each include an outer wall facing the vertical insulation pattern, and an inner wall opposing the outer wall, the inner wall of the upper channel film is located between extension lines of the outer wall of the lower channel film which penetrates the uppermost metallic line, the cutting line includes an upper cutting line which cuts the semiconductor conduction line, and a lower cutting line which cuts the plurality of metallic lines and on a lower surface of the semiconductor conduction line, a width of the upper cutting line is greater than a width of the extension line of the sidewall of the lower cutting line.

According to another aspect of the present disclosure, there is provided a semiconductor memory device including a peripheral logic structures including a peripheral circuit on a substrate, a horizontal conductive substrate extending along an upper surface of the peripheral logic structure, a stacked structure including a plurality of metallic lines stacked in a first direction, on the horizontal conductive substrate, a semiconductor conduction line formed of a semiconductor material on the stacked structure, a vertical structure penetrating the semiconductor conduction line and the stacked structure, and including a channel film, the channel film being electrically connected to the horizontal conductive substrate and a first cutting line which cuts the plurality of metallic lines and the semiconductor conduction line, and is formed of an insulation material, wherein the channel film includes the upper channel film and the first lower channel film extending in the first direction, and an upper connection channel film which connects the upper channel film and the first lower channel film and extends in a second direction different from the first direction, the plurality of metallic lines includes an uppermost metallic line which is closest to the semiconductor conduction line, between a lower surface of the semiconductor conduction line and a lower surface of the uppermost metallic line, the upper connection channel film is connected to the upper channel film and the first lower channel film, the first cutting line includes a first upper cutting line which cuts the semiconductor conduction line, and a first lower cutting line which cuts the plurality of metallic lines and on the lower surface of the semiconductor conduction line, a width of the first upper cutting line is greater than a width of an extension line of sidewall of the first lower cutting line.

According to another aspect of the present disclosure, there is a method of fabricating a semiconductor memory device, the method including forming a lower vertical structure including a first channel film, in a mold structure in which a mold insulation film and a sacrificial insulation film are alternately stacked, forming a semiconductor film on the mold structure, forming an upper cutting opening in the semiconductor film to form a semiconductor conduction line on the mold structure, forming an upper channel hole which penetrates the semiconductor conduction line and vertically overlaps the lower vertical structure, forming a second channel film extending along sidewall of the upper channel hole and connected to the first channel film, forming a cutting line trench which vertically overlaps the upper cutting opening and cuts the mold structure, replacing the sacrificial insulation film with a metallic line through an alternative metal gate process using the cutting line trench and forming a cutting line which fills the cutting line trench.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
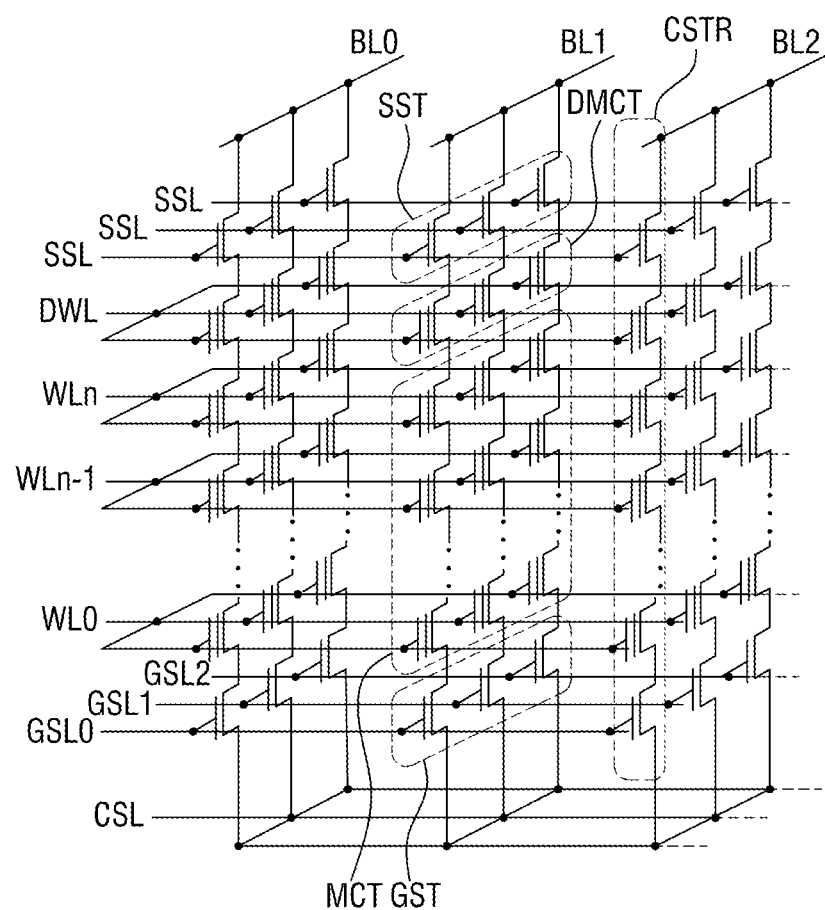
FIG. 1 is a circuit diagram of a semiconductor memory device according to some embodiments.

FIG. 1 is an exemplary circuit diagram for explaining a semiconductor memory device according to some embodiments.

Referring to FIG. 1, a memory cell array of the semiconductor memory device according to some embodiments may include a common source line CSL, a plurality of bit lines, e.g., bit lines BL0 to BL2, and a plurality of cell strings CSTR placed between the common source line CSL and the bit lines BL0 to BL2.

The plurality of cell strings CSTR may be connected in parallel to each of the bit lines BL0 to BL2. The plurality of cell strings CSTR may be commonly connected to the common source line CSL. That is, the plurality of cell strings CSTR may be placed between the plurality of bit lines BL0 to BL2 and the single common source line CSL. A plurality of common source lines CSL may be arranged two-dimensionally. Here, the same voltage may be electrically applied to the common source line CSL or each of the common source lines CSL may be electrically controlled.

For example, each cell string CSTR may be made up of a string selection transistor SST, serially connected memory cells MCT, and a ground selection transistor GST. In addition, each of the memory cells MCT includes a data storage element.

As an example, each cell string CSTR may include a string selection transistor SST connected in series with the bit lines BL0 to BL2. The ground selection transistor GST may be connected to the common source line CSL. The memory cells MCT may be connected in series between the string selection transistor SST and the ground selection transistor GST.

For example, each cell string CSTR may further include a dummy cell DMCT that is connected between the string selection transistor SST and the memory cell MCT. In another example, the dummy cell DMCT may also be connected between the ground selection transistor GST and the memory cell MCT. As yet another example, the ground selection transistor GST in each cell string CSTR may be made up of a plurality of serially connected MOS transistors. As still another example, each cell string CSTR may include a plurality of serially connected string selection transistors. As yet another example, each cell string CSTR may further include an erasing control transistor placed between the bit lines BL0 to BL2 and the string selection transistor SST. The erasing control transistor may be connected in series with the string selection transistor SST.

According to some embodiments, the string selection transistor SST may be controlled by a string selection line SSL. The memory cells MCT may be controlled by a plurality of word lines $WL_0$ to $WL_n$, and the dummy cells DMCT may be controlled by a dummy word line DWL. Also, the ground selection transistor GST may be controlled by a ground selection line GSL. The common source line CSL may be commonly connected to sources of the ground selection transistors GST.

One cell string CSTR may be made up of a plurality of memory cells MCT having different distances from the common source lines CSL. The plurality of word lines $WL_0$ to $WL_n$ and DWL may be placed between the common source lines CSL and the bit lines BL0 to BL2.

The gate electrodes of the memory cells MCT, which are placed at substantially the same distance from the common source lines CSL, are commonly connected to one of the word lines $WL_0$ to $WL_n$ and DWL, and may be in an equipotential state. Unlike this, even if the gate electrodes of the memory cells MCT are placed at substantially the same level from the common source lines CSL, the gate electrodes placed in different rows or columns may be controlled independently.

The ground selection lines GSL0 to GSL2 and the string selection lines SSL may extend, for example, in the same direction as the word lines $WL_0$ to $WL_n$ and DWL. The ground selection lines GSL0 to GSL2 and the string selection lines SSL, which are placed at substantially the same level from the common source lines CSL, may be electrically separated from each other.

If the cell string CSTR includes the erasing control transistors, the erasing control transistors may be controlled by a common erasing control line. The erasing control transistors cause a gate induced drain leakage (GIDL) at the time of an erasing operation of the memory cell array. That is, the erasing control transistors may be GIDL transistors.

Figure 2:
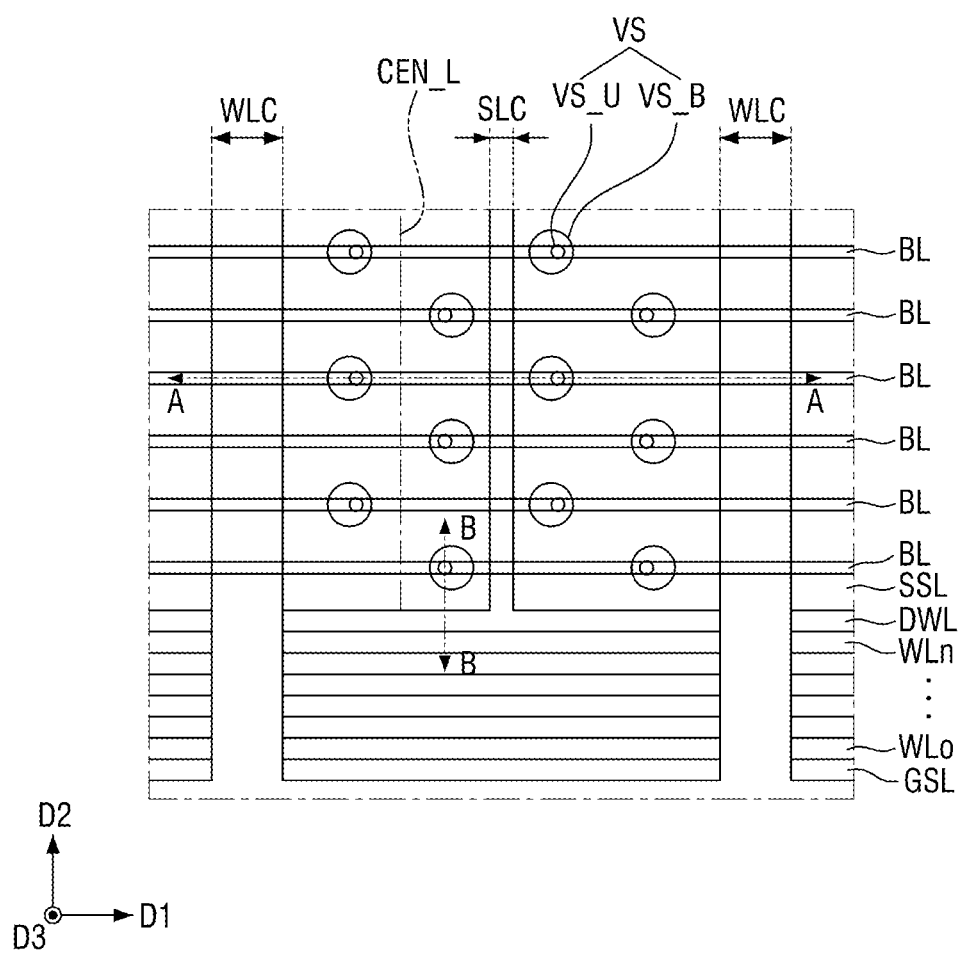
FIG. 2 is a layout diagram of a nonvolatile memory device according to some embodiments.
Figure 3:
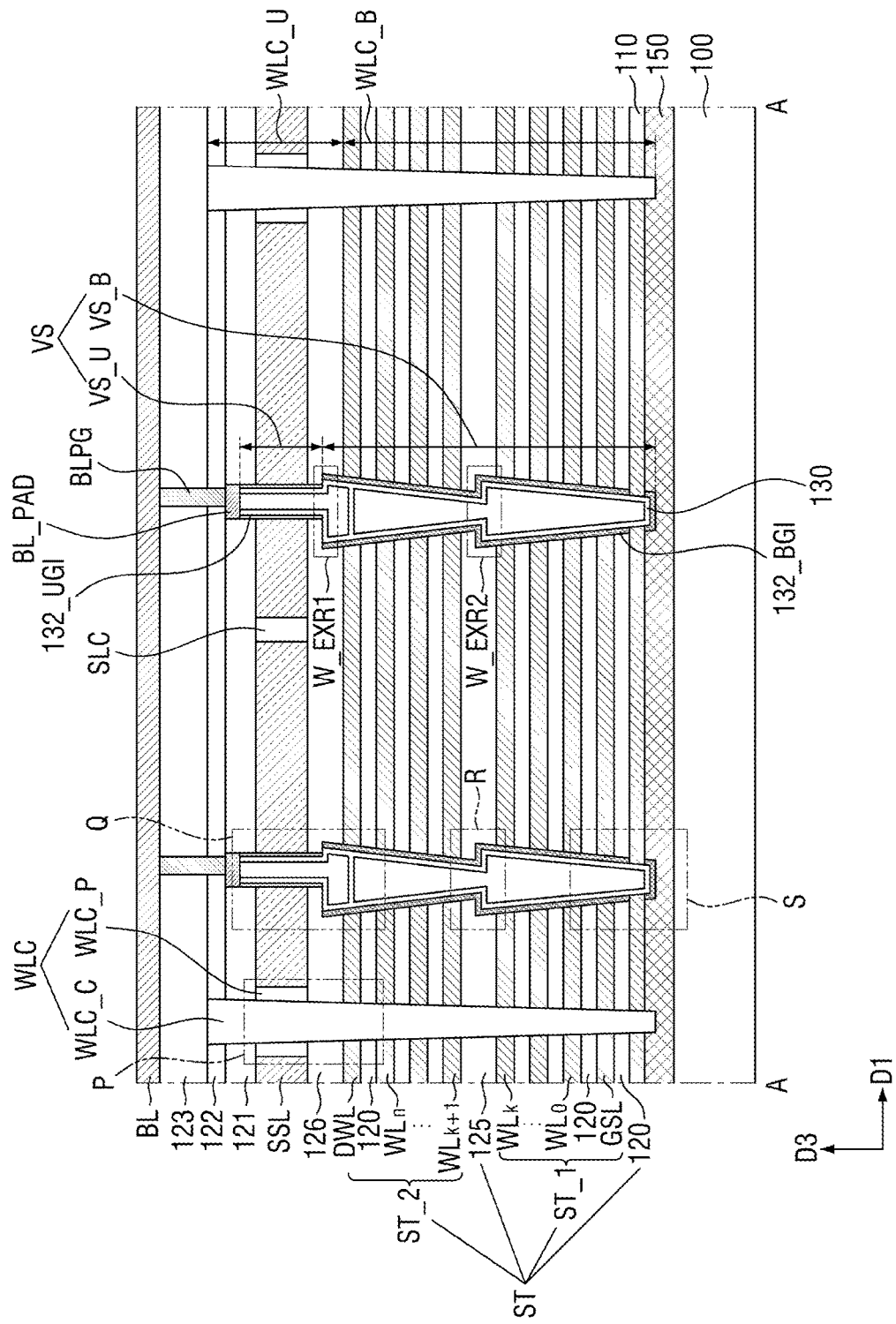
FIG. 3 is a cross-sectional view taken along line A-A in FIG. 2.
Figure 4:
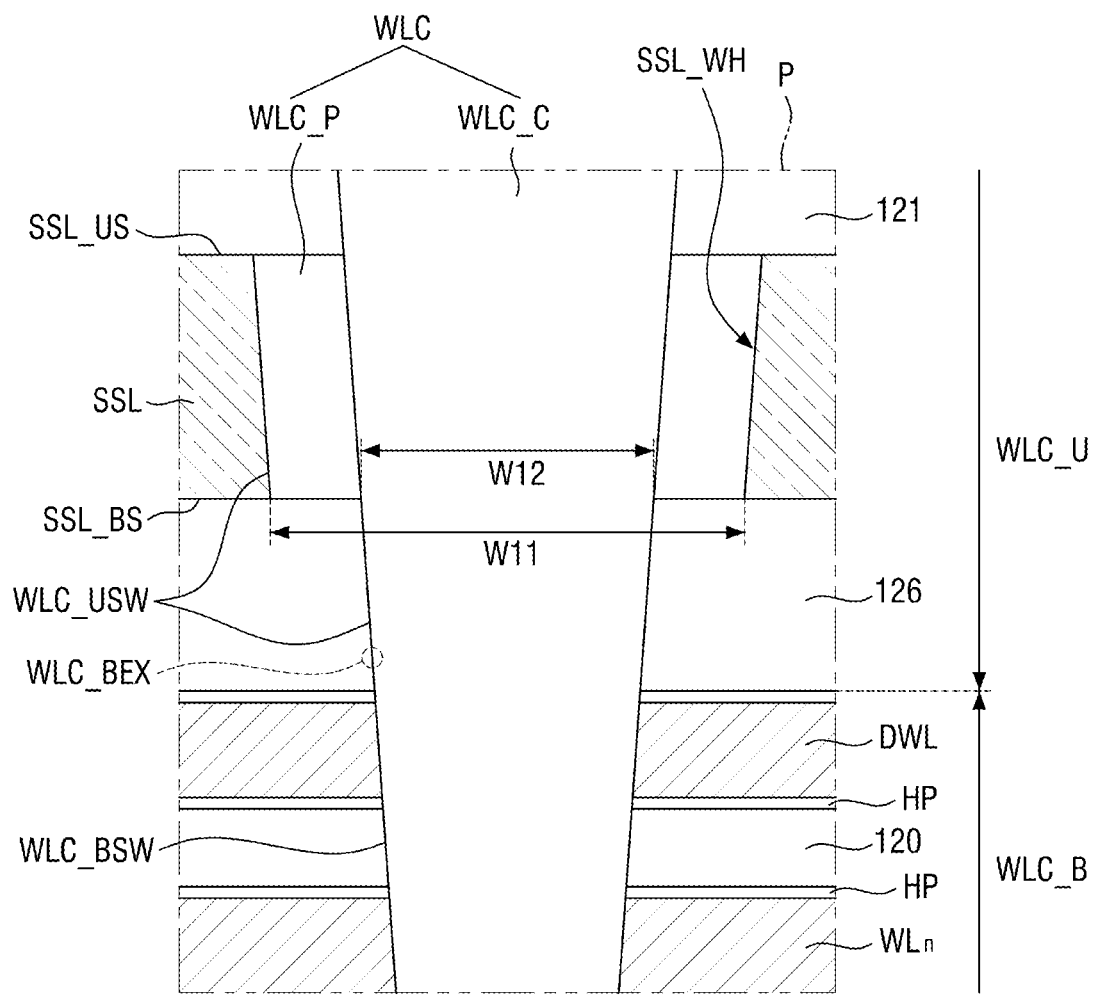
FIG. 4 is a diagram of region P in FIG. 3.
Figure 6:
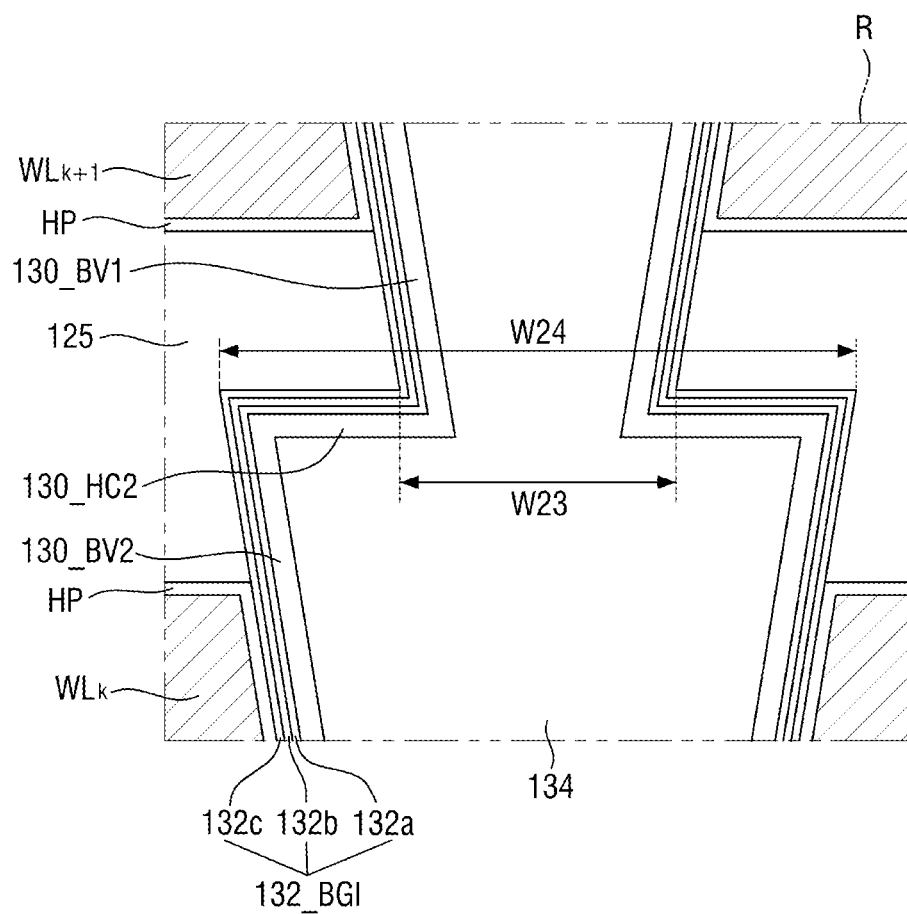
FIG. 6 is a diagram of region R in FIG. 3.
Figure 7A:
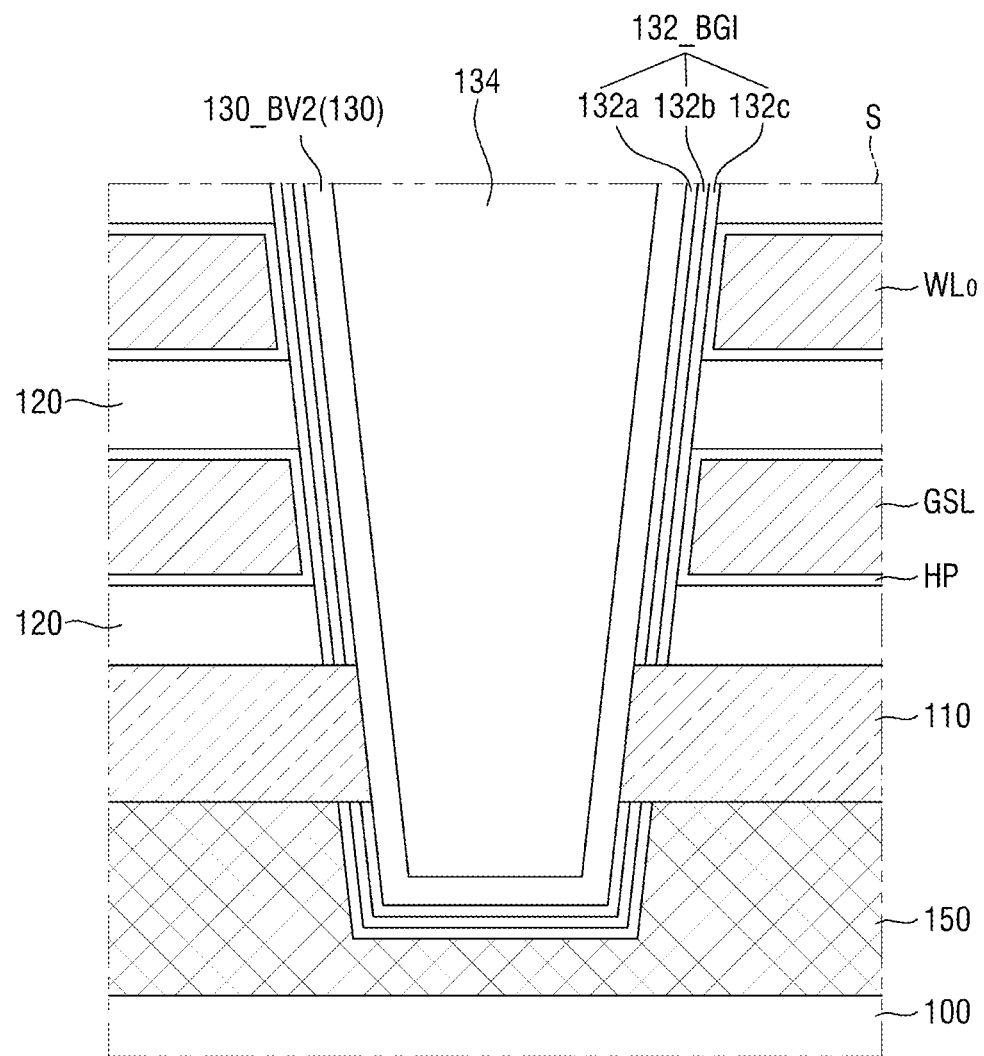
FIGS. 7A and 7B are various views of region S in FIG. 3.
Figure 7B:
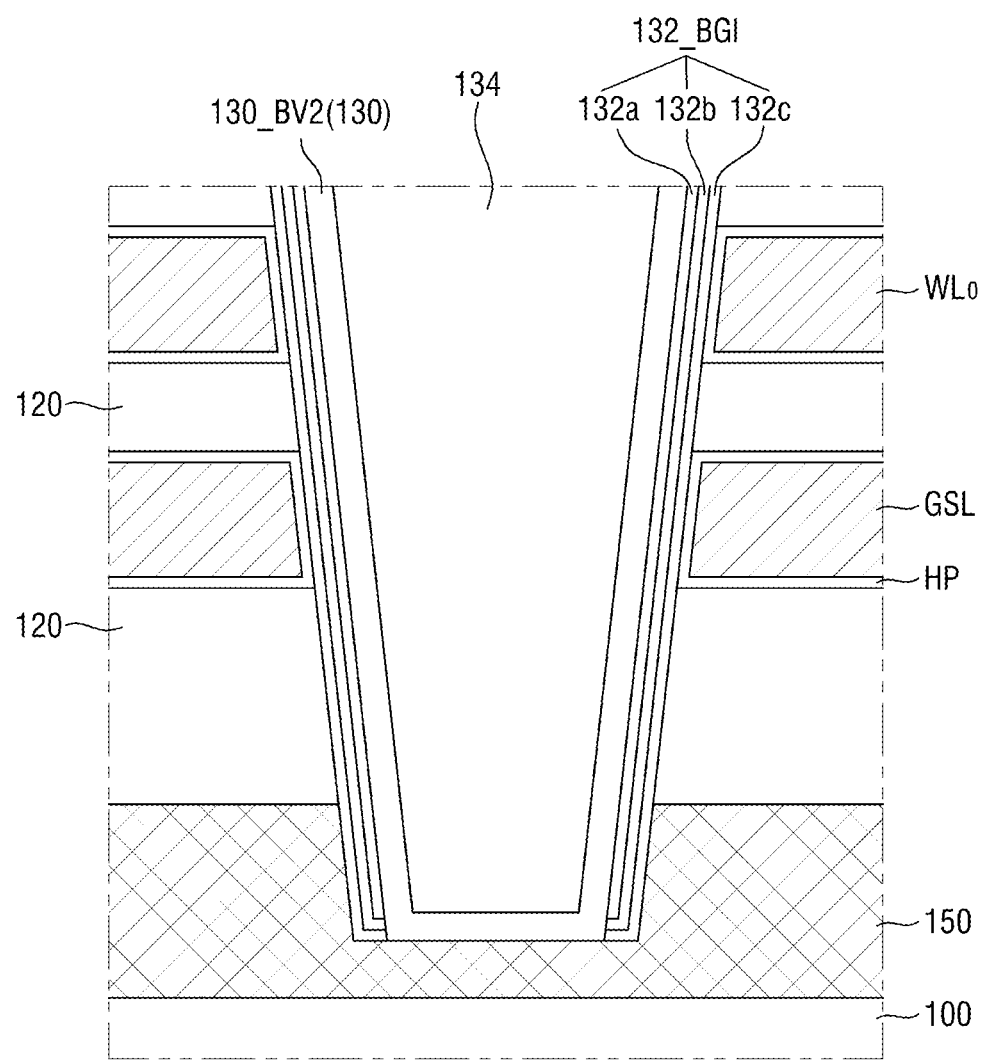
Figure 8:
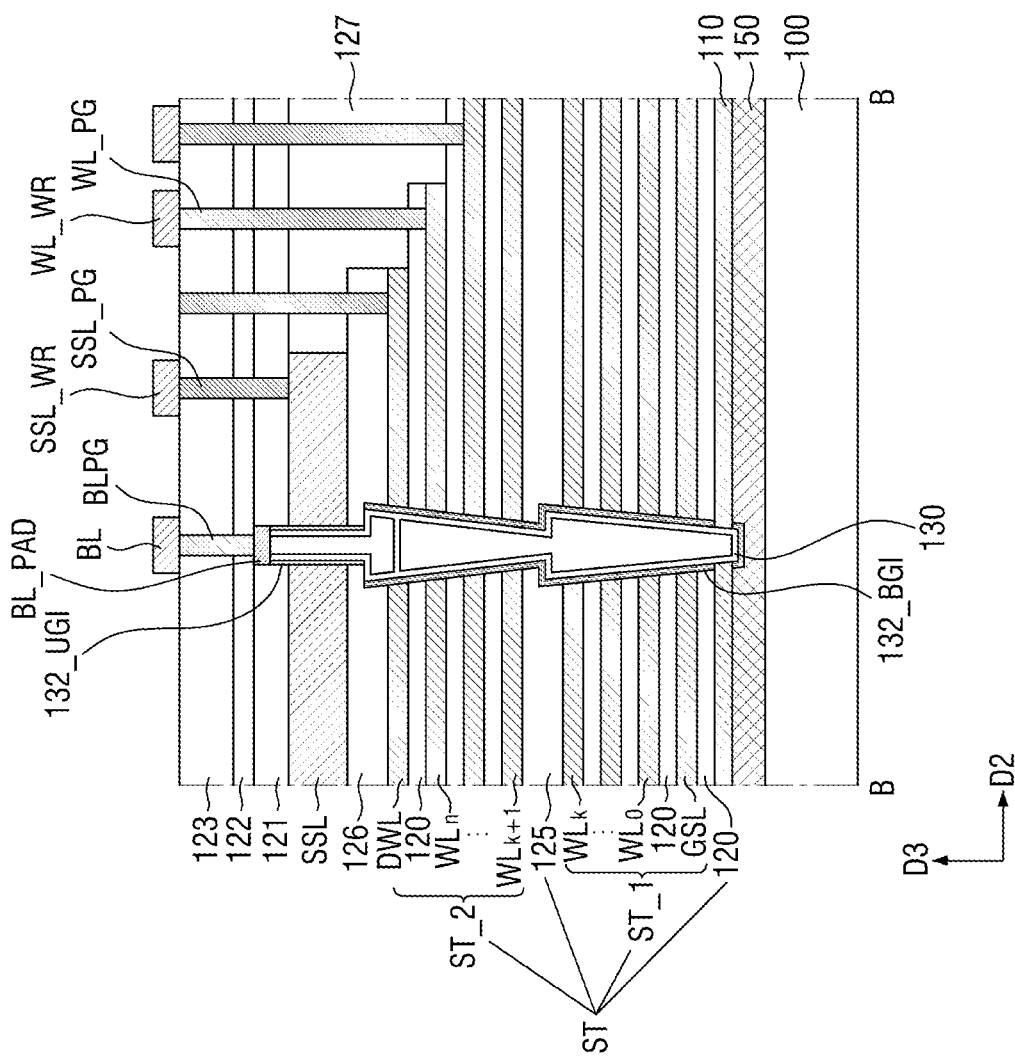
FIG. 8 is a cross-sectional view taken along line B-B in FIG. 2.

FIG. 2 is a layout diagram of a nonvolatile memory device according to some embodiments. FIG. 3 is a cross-sectional view along line A-A of FIG. 2. FIG. 4 is an enlarged view of region P of FIG. 3. FIGS. 5A to 5E are various enlarged views of region Q of FIG. 3. FIG. 6 is an enlarged view of region R of FIG. 3. FIGS. 7A and 7B are various views of region S of FIG. 3. FIG. 8 is a cross-sectional view along line B-B of FIG. 3.

Referring to FIGS. 2 to 8, a semiconductor memory device according to some embodiments may include a substrate 100, a stacked structure ST, a semiconductor conduction line SSL, a plurality of vertical structures VS, a cutting line WLC, a sub-cutting line SLC and a plurality of bit lines BL.

For example, the substrate 100 may include one of, e.g., a silicon substrate, a silicon germanium substrate, a germanium substrate, SGOI (silicon germanium on insulator), SOI (silicon-on-insulator), and GOI (Germanium-On-Insulator). In another example, the substrate 100 may include a semiconductor material, e.g., indium antimonide, lead telluride, indium arsenide, indium phosphide, gallium arsenide or gallium antimonide.

As illustrated in FIG. 3, a horizontal conductive substrate 150 may be placed on the substrate 100. The horizontal conductive substrate 150 may be a common source plate. That is, the horizontal conductive substrate 150 may serve as the common source line CSL of FIG. 1.

The horizontal conductive substrate 150 may include at least one of, e.g., a conductive semiconductor film, a metal silicide film, and a metal film. When the horizontal conductive substrate 150 includes a conductive semiconductor film, the horizontal conductive substrate 150 may include, e.g., at least one of silicon (Si), germanium (Ge), silicon germanium (SiGe), gallium arsenide (GaAs), indium gallium arsenic (InGaAs), aluminum gallium arsenide (AlGaAs) or combinations thereof. The horizontal conductive substrate 150 may have a crystal structure including at least one of, e.g., single crystal, amorphous and polycrystalline. The horizontal conductive substrate 150 may include at least one of, e.g., p-type impurities, n-type impurities, and carbon contained in the semiconductor film.

The stacked structure ST may be placed on the horizontal conductive substrate 150. The stacked structure ST may include a plurality of metallic lines GSL, $WL_0$ to $WL_n$ and DWL and a plurality of inter-electrode insulation films 120 and 125 which are stacked in a third direction D3. The inter-electrode insulation films 120 and 125 are placed between the metallic lines GSL, $WL_0$ to $WL_n$ and DWL spaced apart from each other in the third direction D3.

The plurality of metallic lines GSL, $WL_0$ to $WL_n$ and DWL may include the ground selection line GSL, the plurality of word lines $WL_0$ to $WL_n$, and the dummy word line DWL described previously with reference to FIG. 1, e.g., the ground selection line GSL may be one of the ground selection lines GSL0 to GSL2 in FIG. 1. The ground selection line GSL, the plurality of word lines $WL_0$ to $WL_n$, and the dummy word line DWL may be sequentially stacked on the substrate 100.

Although only six word lines $WL_0$ to $WL_n$ are shown on the ground selection line GSL in FIG. 3, this is only for convenience of explanation, and the embodiment is not limited thereto. Moreover, although the metallic line placed at the uppermost part of the stacked structure ST is shown as the dummy word line DWL, the embodiment is not limited thereto. If the cell string CSTR of FIG. 1 does not include the dummy cell DMCT, the metallic line placed at the uppermost part of the stacked structure ST may be a word line $WL_n$.

The stacked structure ST may include a first sub-stacked structure ST_1, and a second sub-stacked structure ST_2 on the first sub-stacked structure ST_1. The first sub-stacked structure ST_1 may include the ground selection line GSL and some word lines $WL_0$ to $WL_k$. The second sub-stacked structure BST_2 may include remaining word lines $WL_{k+1}$ to $WL_n$ and the dummy word line DWL. Here, n is a natural number greater than k.

The inter-electrode insulation film 125 between the word line $WL_k$ located at the uppermost part of the first sub-stacked structure ST_1 and the word line $WL_{k+1}$ located at the lowermost part of the second sub-stacked structure ST_2 is thicker than the thickness of the inter-electrode insulation film 120 in the first sub-stacked structure ST_1 and the second sub-stacked structure ST_2.

The semiconductor conduction line SSL may be placed on the stacked structure ST. As an example, the semiconductor conduction line SSL be the string selection line of FIG. 1. The semiconductor conduction line SSL may be included in the string selection transistor SST of FIG. 1. As another example, only a part of the semiconductor conduction line SSL may serve as the string selection line of FIG. 1, and a remainder of the semiconductor conduction line SSL may also serve as an erasing control line included in the erasing control transistor.

As illustrated in FIG. 4, the semiconductor conduction line SSL may include an upper surface SSL_US and a lower surface SSL_BS which are opposite to each other in the third direction D3. The lower surface SSL_BS of the semiconductor conduction line SSL faces the dummy word line DWL. An inter-structure insulation film 126 may be placed between the lower surface SSL_BS of the semiconductor conduction line and the upper surface of the dummy word line DWL. The inter-structure insulation film 126 is thicker than the thickness of the inter-electrode insulation film 120 in the first sub-stacked structure ST_1 and the second sub-stacked structure ST_2.

The metallic lines GSL, $WL_0$ to $WL_n$ and DWL and the semiconductor conduction lines SSL may be stacked in a stepwise shape. In FIG. 8, the metallic lines GSL, $WL_0$ to $WL_n$ and DWL and the semiconductor conduction line SSL may be stacked in a stepwise shape in the second direction D2, but embodiments are not limited thereto, e.g., the metallic lines GSL, $WL_0$ to $WL_n$ and DWL and the semiconductor conduction line SSL may be stacked in a stepwise shape in the second direction D1.

The metallic lines GSL, $WL_0$ to $WL_n$ and DWL include a material different from the semiconductor conduction line SSL. For example, the metallic lines GSL, $WL_0$ to $WL_n$ and DWL may include a metallic material, and the semiconductor conduction line SSL may include a semiconductor material. The metallic lines GSL, $WL_0$ to $WL_n$ and DWL may be formed in a fabricating process different from the semiconductor conduction line SSL.

Although the metallic lines GSL, $WL_0$ to $WL_n$ and DWL may include metals, e.g., tungsten (W), cobalt (Co), and nickel (Ni), the type of metal is not limited thereto. In FIG.

4, although the metallic lines GSL, $WL_0$ to $WL_n$ and DWL are shown as being formed of a single film, this is only for convenience of explanation, and the embodiment is not limited thereto. For example, each of the metallic lines GSL, $WL_0$ to $WL_n$ and DWL may further include a barrier conductive film. The barrier conductive film may include at least one of, e.g., metal, metal nitride, metal carbonitride, and two-dimensional (2D) material. For example, the two-dimensional material may be a metallic material and/or a semiconductor material. The 2D material may include a 2D allotrope or a 2D compound.

For example, the semiconductor conduction line SSL may include at least one of silicon (Si), germanium (Ge) and silicon germanium (SiGe). In another embodiment, the semiconductor conduction line SSL may include at least one of III-V compound semiconductors. The semiconductor conduction line SSL may have a crystal structure including at least one of, e.g., single crystal, amorphous and polycrystal. The semiconductor conduction line SSL may further include at least one of, e.g., p-type impurities, n-type impurities, and carbon contained in the semiconductor film.

The inter-electrode insulation films 120 and 125, and the inter-structure insulation film 126 may include, e.g., silicon oxide.

As illustrated in FIGS. 3-4, the cutting line WLC may be placed in the semiconductor conduction line SSL and the stacked structure ST. The cutting line WLC may penetrate the semiconductor conduction line SSL and the stacked structure ST. Adjacent cutting lines WLC may be spaced apart from each other in the first direction D1.

The cutting line WLC may extend in the second direction D2 to cut the semiconductor conduction line SSL and the stacked structure ST, as illustrated in FIG. 2. The cutting line WLC may cut the conductive lines GSL, $WL_0$ to $WL_n$ and DWL and the semiconductor conduction line SSL.

The cutting line WLC may include a lower cutting line WLC_B for cutting the stacked structure ST, and an upper cutting line WLC_U for cutting the semiconductor conduction line SSL. The lower cutting line WLC_B may cut a plurality of metallic lines GSL, $WL_0$ to $WL_n$ and DWL. The lower cutting line WLC_B and the upper cutting line WLC_U may be classified on the basis of a boundary between the stacked structure ST and the inter-structure insulation film 126.

Referring to FIG. 4, sidewall WLC_BSW of the lower cutting line may face the plurality of metallic lines GSL, $WL_0$ to $WL_n$ and DWL. However, the sidewall WLC_USW of the upper cutting line does not face the plurality of metallic lines GSL, $WL_0$ to $WL_n$ and DWL.

The cutting line WLC may include a core cutting line WLC_C and a sidewall cutting line WLC_P. The core cutting line WLC_C may penetrate the conductive lines GSL, $WL_0$ to $WL_n$ and DWL and the semiconductor conduction line SSL. The sidewall cutting line WLC_P is placed in the semiconductor conduction line SSL, but does not penetrate the conductive lines GSL, $WL_0$ to $WL_n$ and DWL. For example, as illustrated in FIG. 3, the sidewall cutting line WLC_P may be wider than the core cutting line WLC_C in the first direction D1, and the core cutting line WLC_C may penetrate through a center of the sidewall cutting line WLC_P.

The core cutting line WLC_C penetrates the first and second interlayer insulation films 121 and 122 and passes through a word line cutting opening SSL_WH included in the semiconductor conduction line SSL. The core cutting line WLC_C passes through the inter-structure insulation film 126 and penetrates the stacked structure ST.

The sidewall cutting line WLC_P may fill the word line cutting opening SSL_WH included in the semiconductor conduction line SSL. The sidewall cutting line WLC_P may be placed in a part of the sidewall of the core cutting line WLC_C. The sidewall cutting line WLC_P is placed between the core cutting line WLC_C and the semiconductor conduction line SSL. However, the sidewall cutting line WLC_P is not placed between the core cutting line WCL_C and the conductive lines GSL, $WL_0$ to $WL_n$ and DWL.

The lower cutting line WLC_B includes a part of the core cutting line WLC_C, but does not include the sidewall cutting line WLC_P. The upper cutting line WLC_U includes the remainder of the core cutting line WLC_C, and the sidewall cutting line WLC_P.

In FIG. 4, on the lower surface SSL_BS of the semiconductor conduction line, a width W11 of the upper cutting line WLC_U is greater than a width W12 of an extension line WLC_BEX of the sidewall WLC_BSW of the lower cutting line. Stated differently, on the lower surface SSL_BS of the semiconductor conduction line, the width W11 of the word line cutting opening SSL_WH is greater than the width W12 of the extension line WLC_BEX of the sidewall WLC_BSW of the lower cutting line.

Since the word line cutting opening SSL_WH is formed before forming the core cutting line WLC_C, the above-mentioned width difference may occur. Since a cutting trench (WLC_PH of FIG. 29) for forming the core cutting line WLC_C is formed after forming the word line cutting opening SSL_WH, reliability problems and performance degradation problems that may occur due to non-etching of the semiconductor conduction line SSL may be prevented.

As an example, as illustrated in FIG. 4, the extension line WLC_BEX of the sidewall WLC_BSW of the lower cutting line may not meet, e.g., contact, the semiconductor conduction line SSL. Stated differently, the core cutting line WLC_C may not meet, e.g., contact, the semiconductor conduction line SSL. As another example, the extension line WLC_BEX of the sidewall WLC_BSW of the lower cutting line may meet one of the semiconductor conduction lines SSL located on both sides of the cutting line WLC, e.g., the core cutting line WLC_C may not be centered with respect to the sidewall cutting line WLC_P to have one of the extension lines WLC_BEX of the sidewall WLC_BSW to contact one of the two semiconductor conduction lines SSL located at both sides of the cutting line WLC. Stated differently, the core cutting line WLC_C may meet one of the semiconductor conduction lines SSL located on both sides of the cutting line WLC.

Although the extension line WLC_BEX of the sidewall WLC_BSW of the lower cutting line is shown to coincide with the sidewall WLC_USW of the upper cutting line, it is only for convenience of explanation, and the embodiment is not limited thereto.

Each of the core cutting line WLC_C and the sidewall cutting line WLC_P may include, for example, at least one of silicon oxide, silicon nitride, silicon oxynitride, and a low-dielectric constant material. The low-dielectric constant material may include, e.g., Fluorinated TetraEthylOrthoSilicate (FTEOS), Hydrogen SilsesQuioxane (HSQ), Bis-benzoCycloButene (BCB), TetraMethylOrthoSilicate (TMOS), OctaMethyleyCloTetraSiloxane (OMCTS), HexaMethylDiSiloxane (HMDS), TriMethylSilyl Borate (TMSB), DiAcetoxyDitertiaryButoSiloxane (DADBS), TriMethylSilil Phosphate (TMSP), PolyTetraFluoroEthylene (PTFE), TOSZ (Tonen SilaZen), FSG (Fluoride Silicate Glass), polyimide nanofoams such as polypropylene oxide, CDO (Carbon Doped silicon Oxide), OSG (Organo Silicate Glass), SiLK, Amorphous Fluorinated Carbon, silica aerogels, silica xerogels, mesoporous silica or combinations thereof.

In the semiconductor memory device according to some embodiments, the cutting line WLC may not include a conductive material. That is, the cutting line WLC may be made up of only an insulating material. For example, each of the core cutting line WLC_C and the sidewall cutting line WLC_P may be formed of an insulating material. As an example, each of the core cutting line WLC_C and the sidewall cutting line WLC_P may each include an oxide-based material. In another example, each of the core cutting line WLC_C and the sidewall cutting line WLC_P may include a plurality of films.

In FIG. 4, although the core cutting line WLC_C and the sidewall cutting line WLC_P are shown as films distinguished from each other, this is only for convenience of explanation, and the embodiment is not limited thereto. As an example, when the core cutting line WLC_C and the sidewall cutting line WLC_P include materials different from each other, the boundary between the core cutting line WLC_C and the sidewall cutting line WLC_P may be distinguished from each other. As another example, when the core cutting line WLC_C and the sidewall cutting line WLC_P include the same material, the boundary between the core cutting line WLC_C and the sidewall cutting line WLC_P may not be distinguished from each other. As still another example, when the core cutting line WLC_C and the sidewall cutting line WLC_P include the same material, but the fabricating methods and the like are different from each other, the boundary between the core cutting line WLC_C and the sidewall cutting line WLC_P may be distinguished from each other.

As illustrated in FIGS. 2-3, the sub-cutting line SLC may be placed between adjacent cutting lines WLC. At least one or more sub-cutting lines SLC may be placed between adjacent cutting lines WLC.

The sub-cutting line SLC may extend in the second direction D2. For example, the sub-cutting line SLC may have a form of a straight line.

The sub-cutting line SLC is placed in the semiconductor conduction line SSL. However, the sub-cutting line SLC is not placed in the stacked structure ST, e.g., the sub-cutting line SLC may extend only in the semiconductor conduction line SSL without extending above or below the semiconductor conduction line SSL. Explained differently, the sub-cutting line SLC cuts the semiconductor conduction line SSL. However, the sub-cutting lines SLC do not cut the conductive lines GSL, $WL_0$ to $WL_n$ and DWL.

The sub-cutting line SLC may include, e.g., at least one of silicon oxide, silicon nitride, silicon oxynitride, and a low-dielectric constant material. For example, the sub-cutting line SLC may include a plurality of films.

As illustrated in FIGS. 2-3, a vertical structure VS extends in the third direction D3. The vertical structure VS may penetrate the semiconductor conduction line SSL and the stacked structure ST. The vertical structure VS may include an upper vertical structure VS_U placed in the semiconductor conduction line SSL, and a lower vertical structure VS_B placed in the stacked structure ST.

In FIG. 2, a size, e.g., a diameter, of the upper vertical structure VS_U is smaller than a size, e.g., a diameter, of the lower vertical structure VS_B. That is, a width of the upper vertical structure VS_U in the first direction D1 is smaller than a width of the lower vertical structure VS_B in the first direction D1. A width of the upper vertical structure VS_U in the second direction D2 is smaller than a width of the lower vertical structure VS_B in the second direction D2.

For example, the center of the upper vertical structure VS_U may not coincide with the center of the lower vertical structure VS_B, e.g., the centers of the upper and lower vertical structures VS_U and VS_B may be offset from each other along the first direction D1. For example, when an imaginary centerline CEN_L extending in the second direction D2 is defined between lower vertical structures VS_B adjacent to each other along the first direction D1, the center of the upper vertical structure VS_U may be closer to the centerline CEN_L than the center of the corresponding lower vertical structure VS_B is.

The bit line pad BL_PAD is placed on the vertical structure VS. The bit line pad BL_PAD may include a conductive material. For example, the bit line pad BL_PAD may include a semiconductor material doped with n-type impurities.

In the semiconductor memory device according to some embodiments, as it goes away from the bit line pad BL_PAD, the vertical structure VS may include a plurality of width expansion regions W_EXR1 and W_EXR2 that increase in width in the first direction D1. For example, as illustrated in FIG. 3, as a distance from the bit line pad BL_PAD in the third direction D3 increases, the vertical structure VS may include first and second width expansion regions W_EXR1 and W_EXR2 between the bit line pad BL_PAD and the substrate 100.

The first width extension region W_EXR1 may be defined, e.g., may extend, between the semiconductor conduction line SSL and the stacked structure ST. For example, the first width extension region W_EXR1 may be defined, e.g., positioned, between the lower surface SSL_BS of the semiconductor conduction line and the upper surface of the dummy word line DWL.

The second width extension region W_EXR2 may be defined, e.g., may extend, in the stacked structure ST. The second width extension region W_EXR2 may be defined, e.g., positioned, between the first sub-stacked structure ST_1 and the second sub-stacked structure ST_2.

Figure 5A:
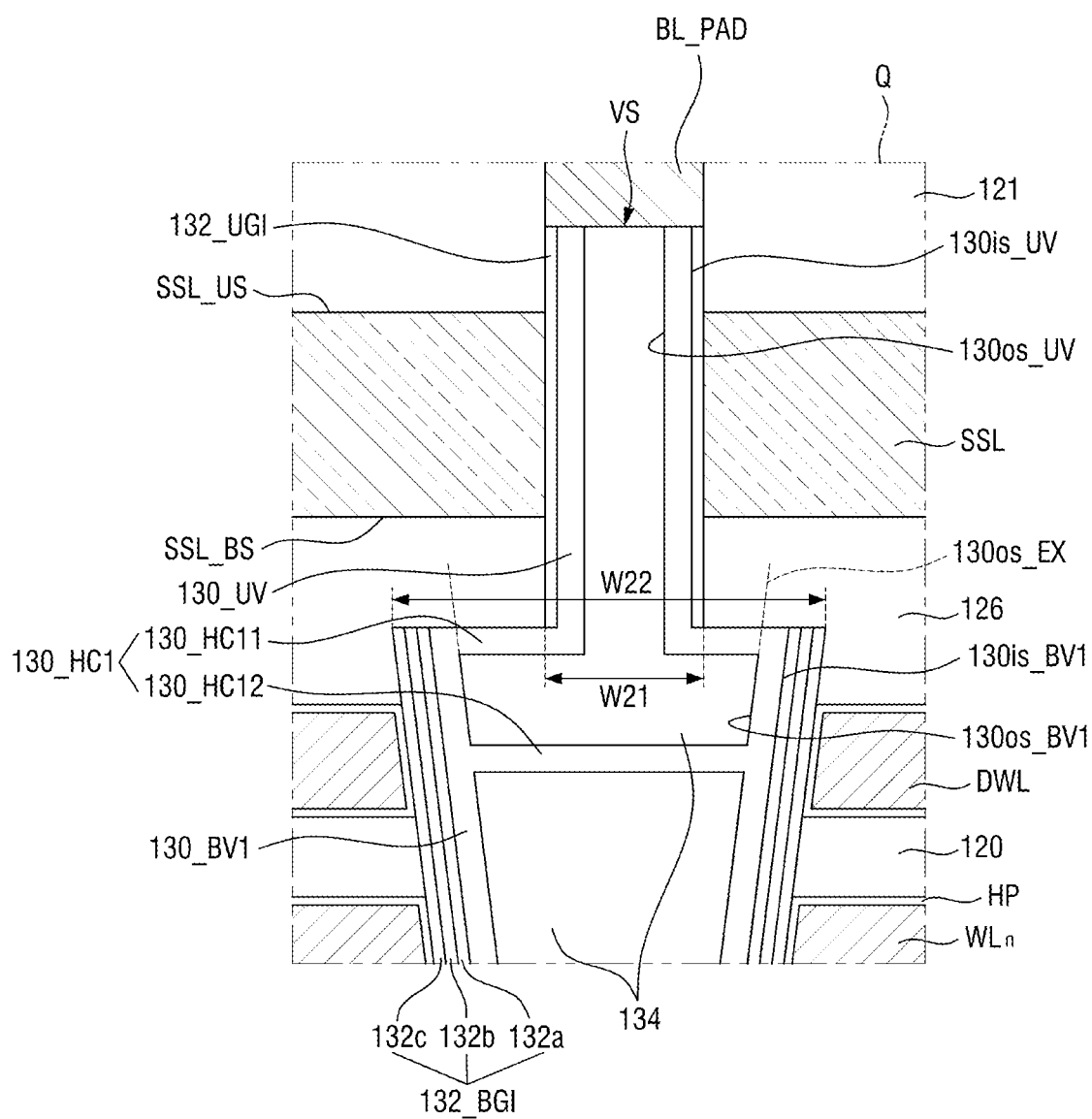
FIGS. 5A to 5E are various views of region Q in FIG. 3.

Referring to FIGS. 3 and 5A, the first width extension region W_EXR1 may have a width W22 that is larger than a width W21 of the upper vertical structure VS_U in the first direction D1. The width W22 is also the width of the lower vertical structure VS_B in the first direction D1.

Also, referring to FIGS. 3, 5A and 6, as a distance from the bit line pad BL_PAD increases in the third direction D3, the width of the lower vertical structure VS_B in the second sub-stacked structure ST_2 in the first direction D1 decreases from W22 to W23. In the second width extension region W_EXR2, the width of the lower vertical structure VS_B in the first direction D1 increases from W23 to W24. Thereafter, as it goes away from the bit line pad BL_PAD, the width of the lower vertical structure VS_B in the first sub-stacked structure ST_1 in the first direction D1 may gradually decrease.

In FIG. 3, although two width expansion regions W_EXR1 and W_EXR2 are shown, the embodiment is not limited thereto. When the stacked structure ST includes three or more sub-stacked structures, the width expansion region may increase depending on the number of the sub-stacked structures.

The vertical structure VS may include a vertical channel film 130 extending in the third direction D3, and a vertical insulation pattern 134 which fills a space defined by the vertical channel film 130. The vertical channel film 130 may be electrically connected to the horizontal conductive substrate 150 that serves as a common source line. The vertical channel film 130 may be in contact with the bit line pad BL_PAD. The vertical channel film 130 may include sidewall parts that extend in the third direction D3, and a bottom part that connects the sidewall parts of the vertical channel film 130. The sidewall parts of the vertical channel film 130 may have a pipe shape having a hollow space inside, e.g., a cylindrical shape or a macaroni shape.

The vertical channel film 130 may include an upper vertical channel film 130_UV, a first lower vertical channel film 130_BV1, a second lower vertical channel film 130_BV2, an upper connection channel film 130_HC1, and a lower connection channel film 130_HC2. The upper vertical channel film 130_UV may be placed in the upper vertical structure VS_U. The first lower vertical channel film 130_BV1, the second lower vertical channel film 130_BV2, the upper connection channel film 130_HC1, and the lower connection channel film 130_HC2 may be placed inside the lower vertical structure VS_B.

Each of the upper vertical channel film 130_UV, the first lower vertical channel film 130_BV1, and the second lower vertical channel film 130_BV2 may extend in the third direction D3.

The upper vertical channel film 130_UV may be placed in the semiconductor conduction line SSL. The upper vertical channel film 130_UV may extend along the sidewalls of the semiconductor conduction line SSL between the lower surface SSL_BS of the semiconductor conduction line and the upper surface SSL_US of the semiconductor conduction line.

The first lower vertical channel film 130_BV1 may be placed in the second sub-stacked structure ST_2. The first lower vertical channel film 130_BV1 may extend along the sidewalls of the word lines $WL_{k+1}$ to $WL_n$ and the dummy word line DWL included in the second sub-stacked structure ST_2.

The second lower vertical channel film 130_BV2 may be placed in the first sub-stacked structure ST_1. The second lower vertical channel film 130_BV2 may extend along sidewalls of the ground selection line GSL and the word lines $WL_0$ to $WL_k$ included in the first sub-stacked structure ST_2.

Each of the upper connection channel film 130_HC1 and the lower connection channel film 130_HC2 may extend in the first direction D1. In FIGS. 5A to 6, although the upper connection channel film 130_HC1 and the lower connection channel film 130_HC2 are shown as being parallel to the first direction D1 aligned with the upper surface of the substrate 100, this is only for convenience of explanation, and the embodiment is not limited thereto. For example, the upper connection channel film 130_HC1 and the lower connection channel film 130_HC2 may extend in an oblique direction having an inclination with respect to the first direction D1.

The upper connection channel film 130_HC1 connects the upper vertical channel film 130_UV and the first lower vertical channel film 130_BV1. Between the lower surface DWL_BS of the dummy word line placed at the uppermost part of the stacked structure ST and the lower surface SSL_BS of the semiconductor conduction line, the upper connection channel film 130_HC1 may connect the upper vertical channel film 130_UV and the first lower vertical channel film 130_BV1.

The upper connection channel film 130_HC1 may include a first upper connection channel film 130_HC11 and a second upper connection channel film 130_HC12. The first upper connection channel film 130_HC11 and the second upper connection channel film 130_HC12 may be spaced apart from each other in the third direction D3.

Between the lower surface DWL_BS of the dummy word line and the lower surface SSL_BS of the semiconductor conduction line, the first upper connection channel film 130_HC11 may directly connect the upper vertical channel film 130_UV and the first lower vertical channel film 130_BV1. The second upper connection channel film 130_HC12 is directly connected to the first lower vertical channel film 130_BV1, but is not directly connected to the upper vertical channel film 130_UV. Stated differently, the vertical channel film 130 includes the first upper connection channel film 130_HC11 that bends in the first direction D1, below the lower surface SSL_BS of the semiconductor conduction line.

The first width extension region W_EXR1 is defined at a position where the upper connection channel film 130_HC1 is formed. At the position where the upper connection channel film 130_HC1 is formed, the width of the vertical structure VS may extend from W21 to W22. More specifically, at the position where the first upper connection channel film 130_HC11 is formed, the width of the vertical structure VS may extend from W21 to W22.

In FIG. 5A, the upper vertical channel film 130_UV includes outer walls 130*os*_UV facing the vertical insulation pattern 134, and inner walls 130*is*_UV opposing the outer walls 130*os*_UV of the upper vertical channel film 130_UV. The first lower vertical channel film 130_BV1 includes outer walls 130*os*_BV1 facing the vertical insulation pattern 134, and inner walls 130*is*_BV1 opposing the outer walls 130*os*_BV1 of the first lower vertical channel film 130_BV1.

The inner walls 130*is*_UV of the upper vertical channel film may be placed between extension lines 130*os*_EX of the outer walls 130*os*_BV1 of the first lower vertical channel film 130_BV1 penetrating the dummy word line DWL. Stated differently, from a viewpoint of a plan view, the upper vertical channel film 130_UV in the upper vertical structure VS_U may be entirely included inside the first lower vertical channel film 130_BV1 in the lower vertical structure VS_B.

The upper connection channel film 130_HC1 may divide the vertical insulation pattern 134 into two parts. More specifically, while the first upper connection channel film 130_HC11 may not divide the vertical insulation pattern 134 into two parts, e.g., the first upper connection channel film 130_HC11 may be above the vertical insulation pattern 134, the second upper connection channel film 130_HC12 may device the vertical insulation pattern 134 into two parts, e.g., two parts separated from each other along the third direction D3 by the second upper connection channel film 130_HC12.

As illustrated in FIG. 6, the lower connection channel film 130_HC2 connects the first lower vertical channel film 130_BV1 and the second lower vertical channel film 130_BV2. Between the upper surface of the word line $WL_k$ placed on the uppermost part of the first sub-stacked structure ST_1 and the lower surface of the word line $WL_{k+1}$ placed on the lowermost part of the second sub-stacked structure ST_2, the lower connection channel film 130_HC2 directly connects the first lower vertical channel film 130_BV1 and the second lower vertical channel film 130_BV2. Stated differently, in the inter-electrode insulation film 125 between the first sub-stacked structure ST_1 and the second sub-stacked structure ST_2, the vertical channel film 130 includes the lower connection channel film 130_HC2 that bends in the first direction D1.

The second width extension region W_EXR2 is defined at the position where the lower connection channel film 130_HC2 is formed. At the position where the lower connection channel film 130_HC2 is formed, the width of the vertical structure VS may extend from W23 to W24.

The vertical channel film 130 may include a semiconductor material, e.g., silicon (Si), germanium (Ge) or a mixture thereof. Alternatively, the vertical channel film 130 may include a semiconductor material, e.g., a metal oxide semiconductor material, an organic semiconductor material, and a carbon nanostructure. In the semiconductor memory device according to some embodiments, the vertical channel film 130 may include polycrystalline silicon.

Referring to FIG. 5A, no air gap may be formed in the vertical insulation pattern 134. The vertical insulation pattern 134 may include, e.g., at least one of silicon oxide, silicon oxynitride, and a low-dielectric constant material.

Figure 5B:
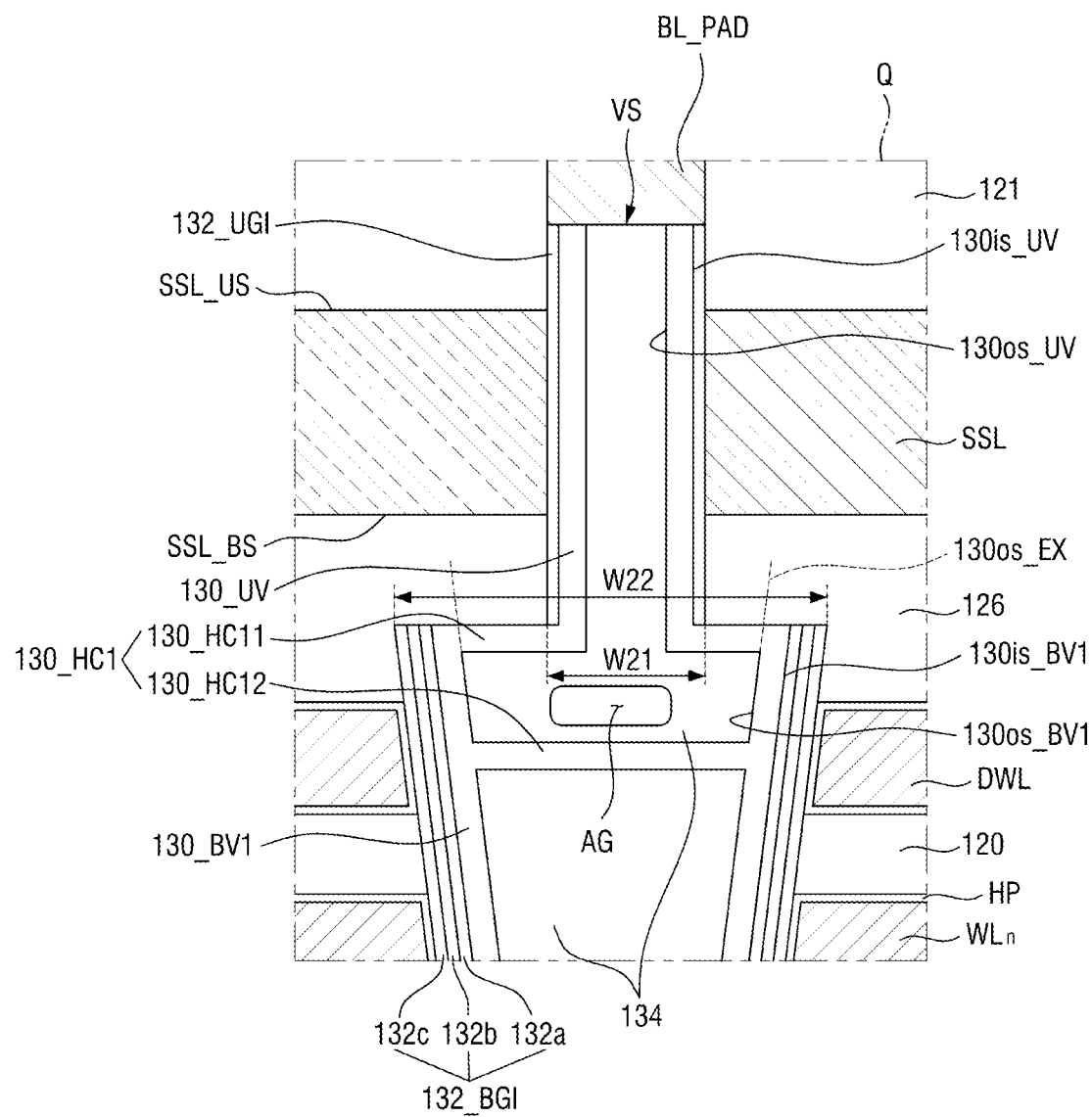

Referring to FIG. 5B, an air gap AG may be formed in the vertical insulation pattern 134. For example, the air gap AG may be formed between the first and second upper connection channel films 130_HC11 and 130_HC12.

Figure 5C:
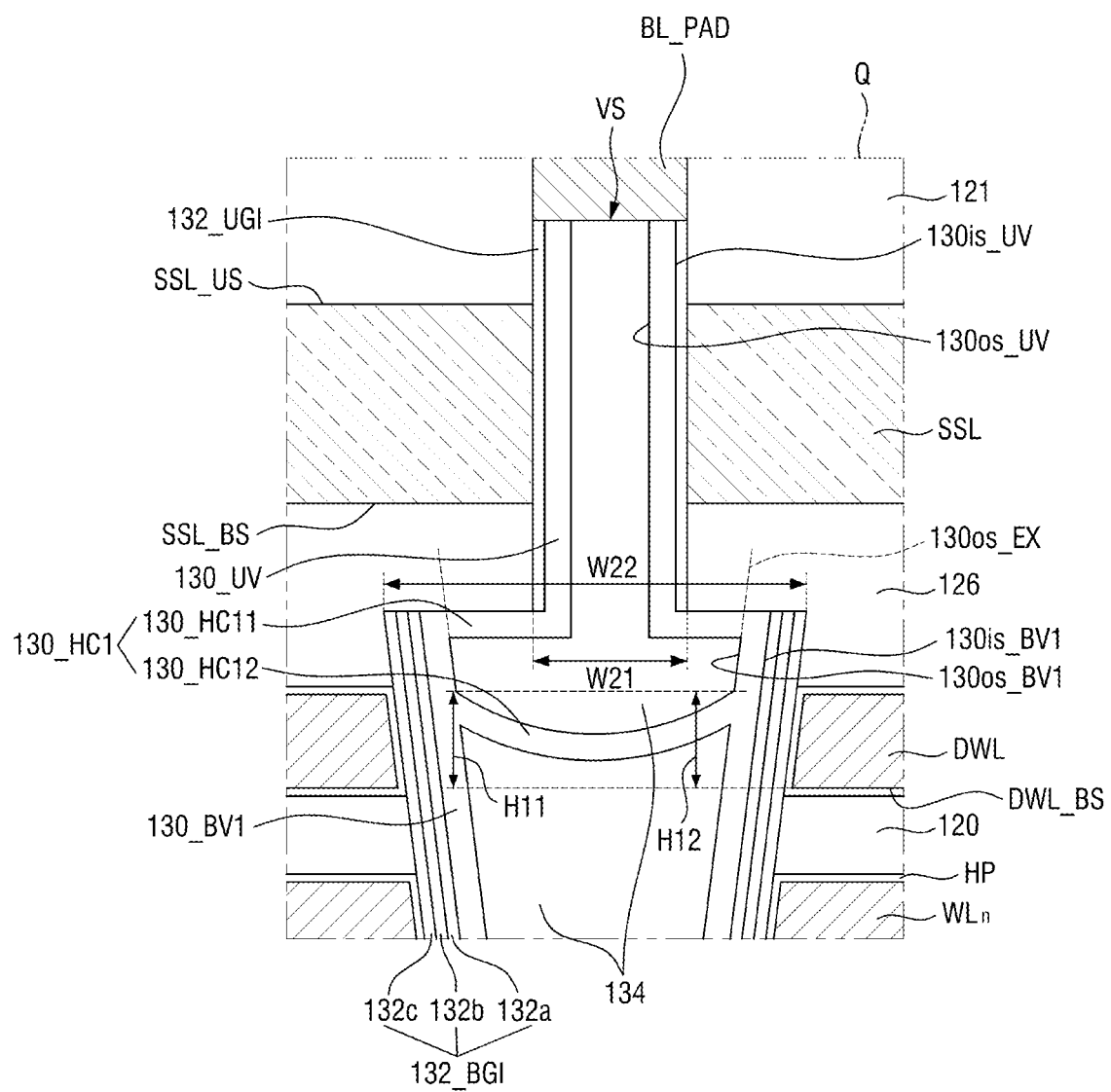
Figure 5D:
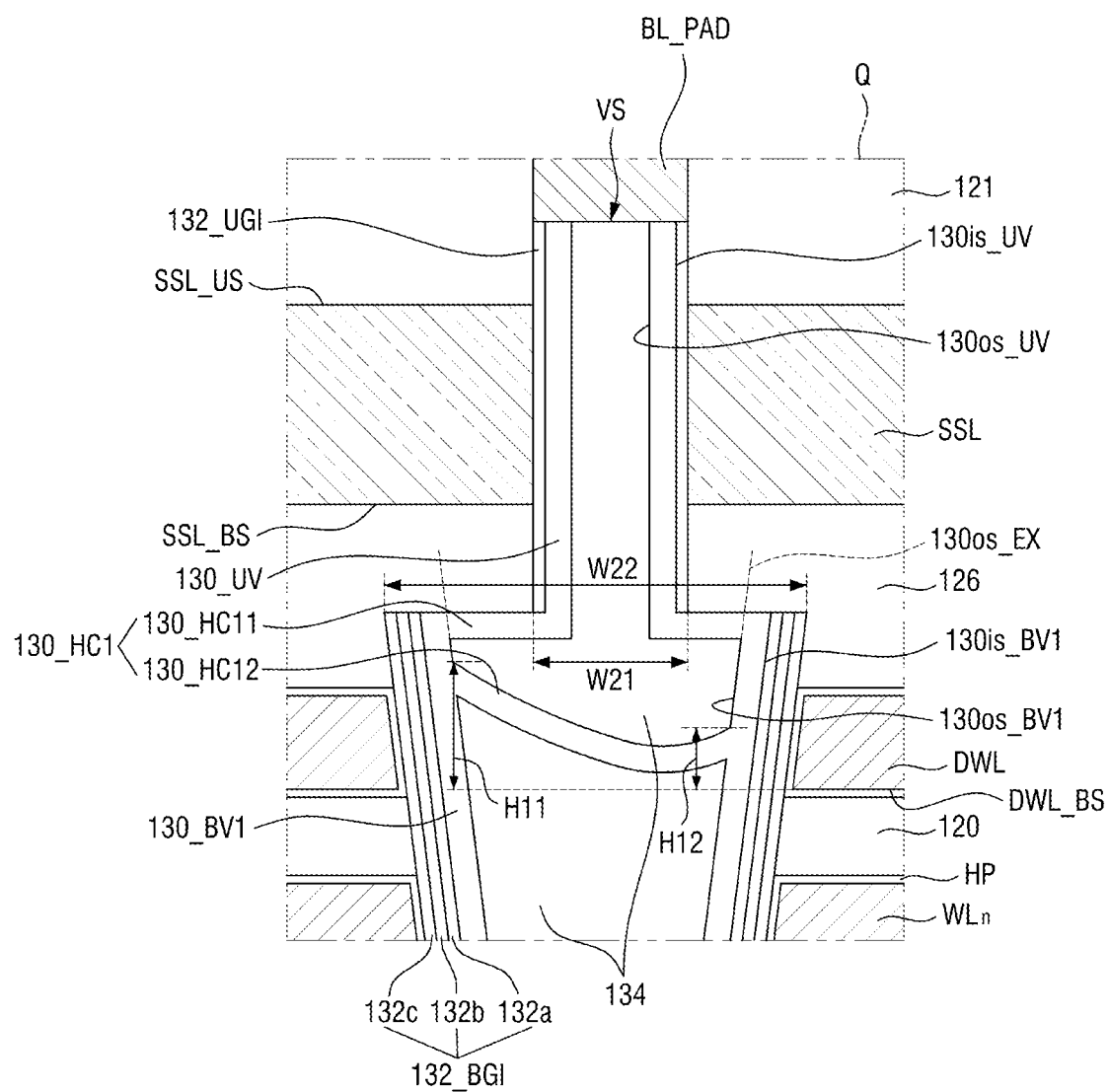

Referring to FIGS. 5C and 5D, the second upper connection channel film 130_HC12 may have a curved surface shape protruding downward. For example, as illustrated in FIG. 5C, the second upper connection channel film 130_HC12 may have a symmetrical curve. In another example, as illustrated in FIG. 5D, the second upper connection channel film 130_HC12 may have an asymmetrical curve.

In detail, as illustrated in FIG. 5C, on the basis of a lower surface DWL_BS of the dummy word line, a height H11 of the uppermost part of the second upper connection channel film 130_HC12 on one side of the vertical insulation pattern 134 may be substantially the same as a height H12 of the uppermost part of the second upper connection channel film 130_HC12 on the other side of the vertical insulation pattern 134.

In detail, as illustrated in FIG. 5D, on the basis of the lower surface DWL_BS of the dummy word line, the height H11 of the uppermost part of the second upper connection channel film 130_HC12 on one side of the vertical insulation pattern 134 is higher than the height H12 of the uppermost part of the second upper connection channel film 130_HC12 on the other side of the vertical insulation pattern 134.

The vertical structure VS may include an upper vertical channel film 130_UV, and an upper channel insulation film 132_UGI placed on the semiconductor conduction line SSL. The vertical structure VS may include a lower channel insulation film 132_BGI placed between the lower vertical channel films 130_BV1 and 130_BV2 and the metallic lines GSL, $WL_0$ to $WL_n$ and DWL, and between the lower vertical channel films 130_BV1 and 130_BV2 and the inter-electrode insulation film 120. The upper channel insulation film 132_UGI and the lower channel insulation film 132_BGI may extend along the upper vertical channel film 130_UV and the lower vertical channel films 130_BV1 and 130_BV2.

In FIGS. 3 and 5A to 7B, the lower channel insulation film 132_BGI may include, e.g., a tunnel insulation film 132a, a charge storage film 132b, and a blocking insulation film 132c sequentially placed on the vertical channel film 130. The tunnel insulation film 132a, the charge storage film 132b, and the blocking insulation film 132c are merely examples, and the embodiment is not limited thereto.

The tunnel insulation film 132a may include, e.g., silicon oxide or a high-dielectric constant material (e.g., aluminum oxide ($Al_2O_3$) or hafnium oxide ($HfO_2$)). The charge storage film 132b may include, e.g., silicon nitride. The blocking insulation film 132c may include, e.g., silicon oxide or a high-dielectric constant material (e.g., aluminum oxide ($Al_2O_3$) or hafnium oxide ($HfO_2$)). In the semiconductor memory device according to some embodiments, the tunnel insulation film 132a and the blocking insulation film 132c may include, e.g., silicon oxide.

For example, a horizontal insulation pattern HP may be placed between the metallic lines GSL, $WL_0$ to $WL_n$ and DWL and the lower channel insulation film 132_BGI. The horizontal insulation pattern HP may include, e.g., silicon oxide or a high-dielectric constant material (e.g., aluminum oxide ($Al_2O_3$) or hafnium oxide ($HfO_2$)). In another example, the horizontal insulation pattern HP may not be placed between the metallic lines GSL, $WL_0$ to $WL_n$ and DWL and the lower channel insulation film 132_BGI.

In FIG. 7A, the tunnel insulation film 132a, the charge storage film 132b, and the blocking insulation film 132c may be separated in the lower part of the second lower vertical channel film 130_BV2. The separated tunnel insulation film 132a, charge storage film 132b, and blocking insulation film 132c may expose a part of the second lower vertical channel film 130_BV2. A vertical structure support film 110 may be placed between the separated tunnel insulation film 132a, charge storage film 132b, and blocking insulation film 132c. The vertical structure support film 110 may electrically connect the horizontal conductive substrate 150 and the vertical channel film 130. The vertical structure support film 110 may include a semiconductor material, e.g., silicon (Si), germanium (Ge) or a mixture thereof.

In FIG. 7B, the vertical structure support film 110 may not be placed between the horizontal conductive substrate 150 and the stacked structure ST. In such a case, the sidewall parts of the second lower vertical channel film 130_BV2 are not exposed and the bottom part of the second lower vertical channel film 130_BV2 may be exposed. The tunnel insulation film 132a, the charge storage film 132b, and the blocking insulation film 132c between the bottom part of the second lower vertical channel film 130_BV2 and the horizontal conductive substrate 150 may be removed. The vertical channel film 130 may be electrically connected to the horizontal conductive substrate 150 through the bottom part of the second lower vertical channel film 130_BV2.

In FIGS. 5A to 5E, unlike the lower channel insulation film 132_BGI, the upper channel insulation film 132_UGI may include, e.g., silicon oxide. In the semiconductor memory device according to some embodiments, the stacked structure of the upper channel insulation film 132_UGI may be different from the structure of the lower channel insulation film 132_BGI.

The upper channel insulation film 132_UGI may be in contact with the semiconductor conduction line SSL. That is, the metallic conductive material may not be placed between the upper channel insulation film 132_UGI and the semiconductor conduction line SSL. Also, the lower channel insulation film 132_BGI may not be directly connected to the upper channel insulation film 132_UGI.

Figure 5E:
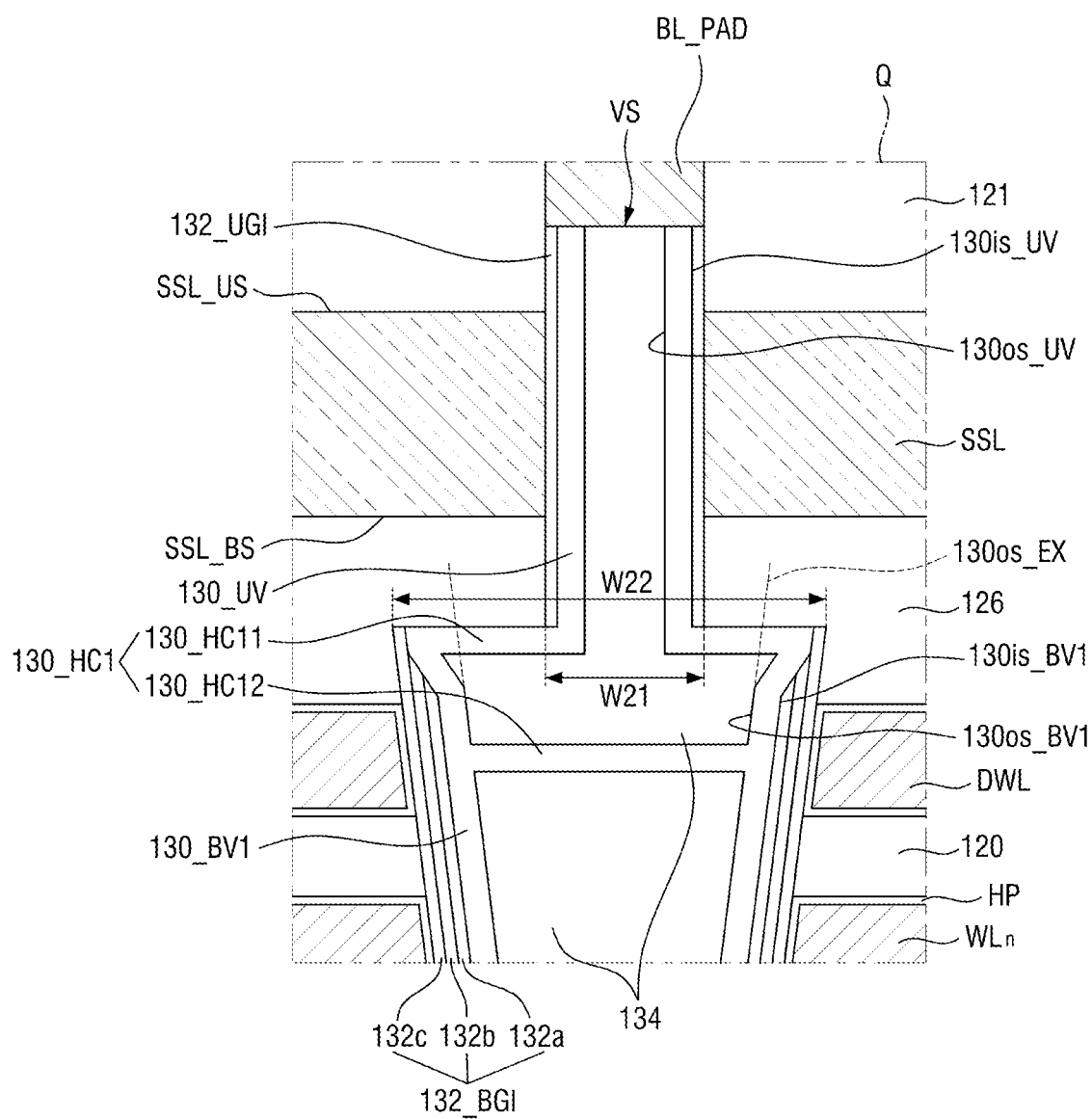

In FIG. 5E, a part of the lower channel insulation film 132_BGI placed in the inter-structure insulation film 126 may be etched. During the fabricating process, the tunnel insulation film 132a and the charge storage film 132b may be partially etched. Accordingly, the uppermost part of the lower channel insulation film 132_BGI may have a wedge-like shape. That is, the first lower vertical channel film 130_BV1 may cover the uppermost surfaces of the tunnel insulation film 132a and the charge storage film 132b. However, unlike the shown one, it is needless to say that a part of the blocking insulation film 132c is also be etched or only a part of the tunnel insulation film 132a may be etched.

First to third interlayer insulation films 121, 122 and 123 may be sequentially placed on the semiconductor conduction line SSL. A fourth interlayer insulation film 127 that covers the stepped part of the stacked structure ST may be placed on the substrate 100.

A bit line pad BL_PAD may be placed in the first interlayer insulation film 121. The cutting line WLC may penetrate the first interlayer insulation film 121 and the second interlayer insulation film 122. The first to fourth interlayer insulation films 121, 122, 123 and 127 may each include, e.g., at least one of silicon oxide, silicon oxynitride, and a low-dielectric constant material.

The bit line BL may be placed on the semiconductor conduction line SSL. The bit line BL may extend in the first direction D1. The bit line BL may be electrically connected to at least one of the vertical channel films 130. The bit line BL may be formed on the third interlayer insulation film 123. The bit line BL may be electrically connected to the bit line pad BL_PAD via a bit line plug BLPG.

A selection line wiring SSL_WR and a word line wiring WL_WR may be placed on the third interlayer insulation film 123. The selection line wiring SSL_WR may be electrically connected to the semiconductor conduction line SSL via a selection line plug SSL_PG. The word line wiring WL_WR may be electrically connected to the metallic lines GSL, and $WL_0$ to $WL_n$ via a word line plug WL_PG. The dummy word line DWL is connected to the word line plug WL_PG, but may not be connected to the word line wiring WL_WR.

The bit line BL, the selection line wiring SSL_WR, the word line wiring WL_WR, the bit line plug BLPG, the selection line plug SSL_PG and the word line plug WL_PG each include a conductive material.

Figure 9A:
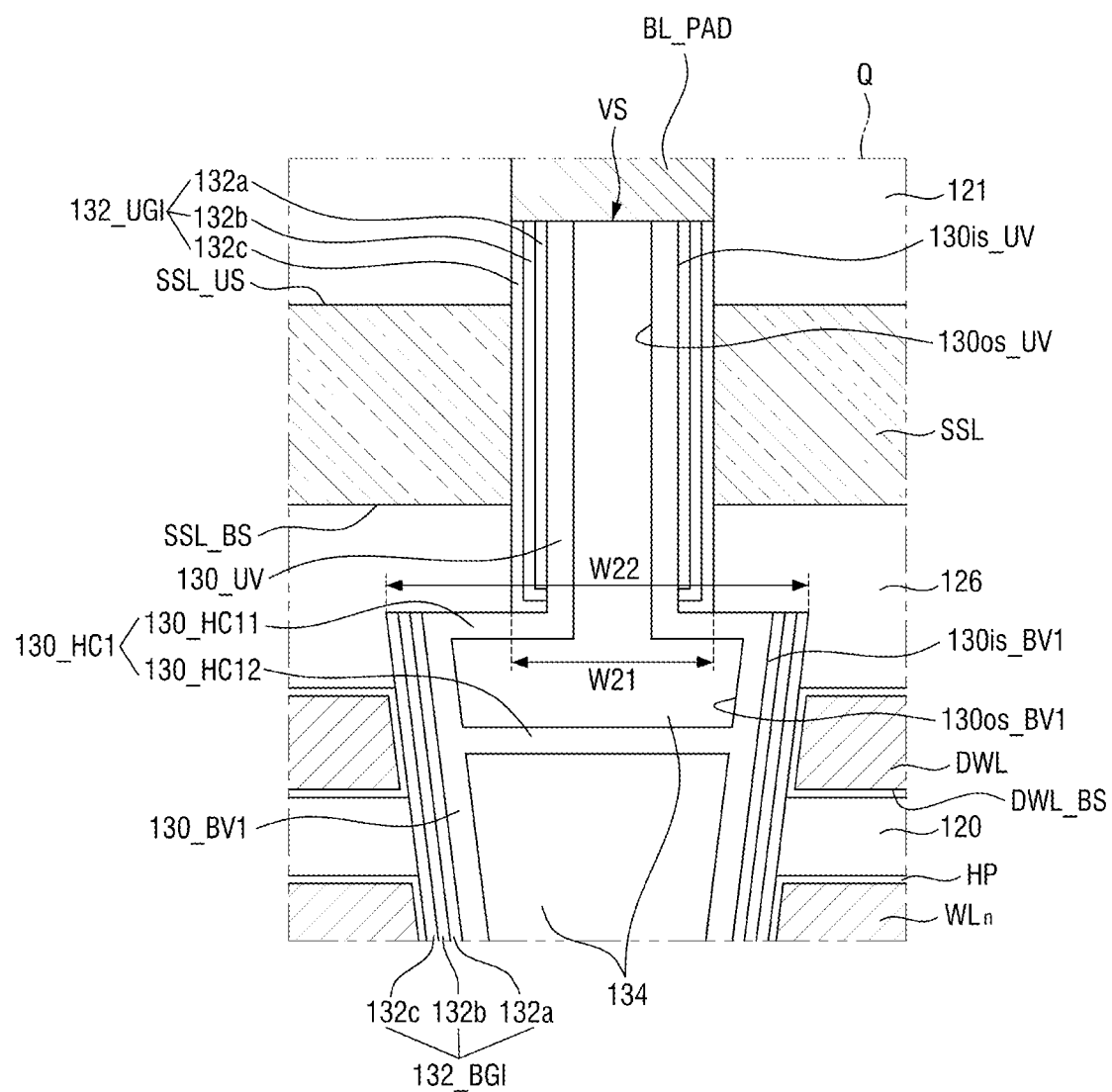
FIGS. 9A and 9B are diagrams of a semiconductor memory device according to some embodiments.
Figure 9B:
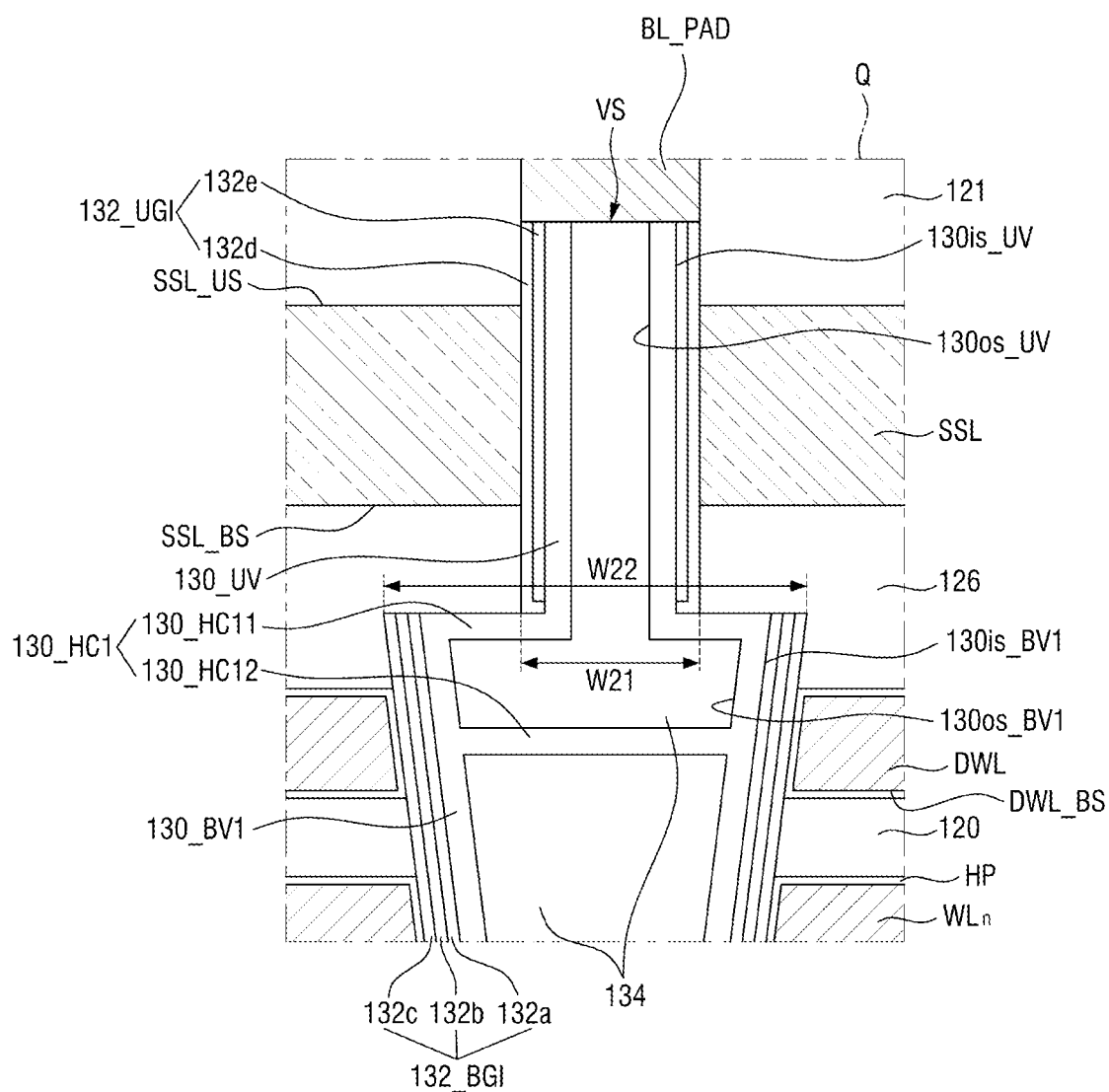

FIGS. 9A and 9B are diagrams for explaining a semiconductor memory device according to some embodiments. For convenience of explanation, differences from those described using FIGS. 2 to 8 will be mainly described.

Referring to FIG. 9A, in the semiconductor memory device according to some embodiments, the stacked structure of the upper channel insulation film 132_UGI may be the same as the structure of the lower channel insulation film 132_BGI. The upper channel insulation film 132_UGI may include a tunnel insulation film 132a, a charge storage film 132b, and a blocking insulation film 132c, which are sequentially placed on the upper vertical channel film 130_UV.

Referring to FIG. 9B, in the semiconductor memory device according to some embodiments, the upper channel insulation film 132_UGI may include an interface insulation film 132e and a high-dielectric constant insulation film 132d which are sequentially placed on the upper vertical channel film 130_UV. The interface insulation film 132e may be placed between the high-dielectric constant insulation film 132d and the upper vertical channel film 130_UV.

The interface insulation film 132e may include, e.g., silicon oxide. The high-dielectric constant insulation film 132d may include, e.g., one or more of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide or lead zinc niobate.

Figure 10:
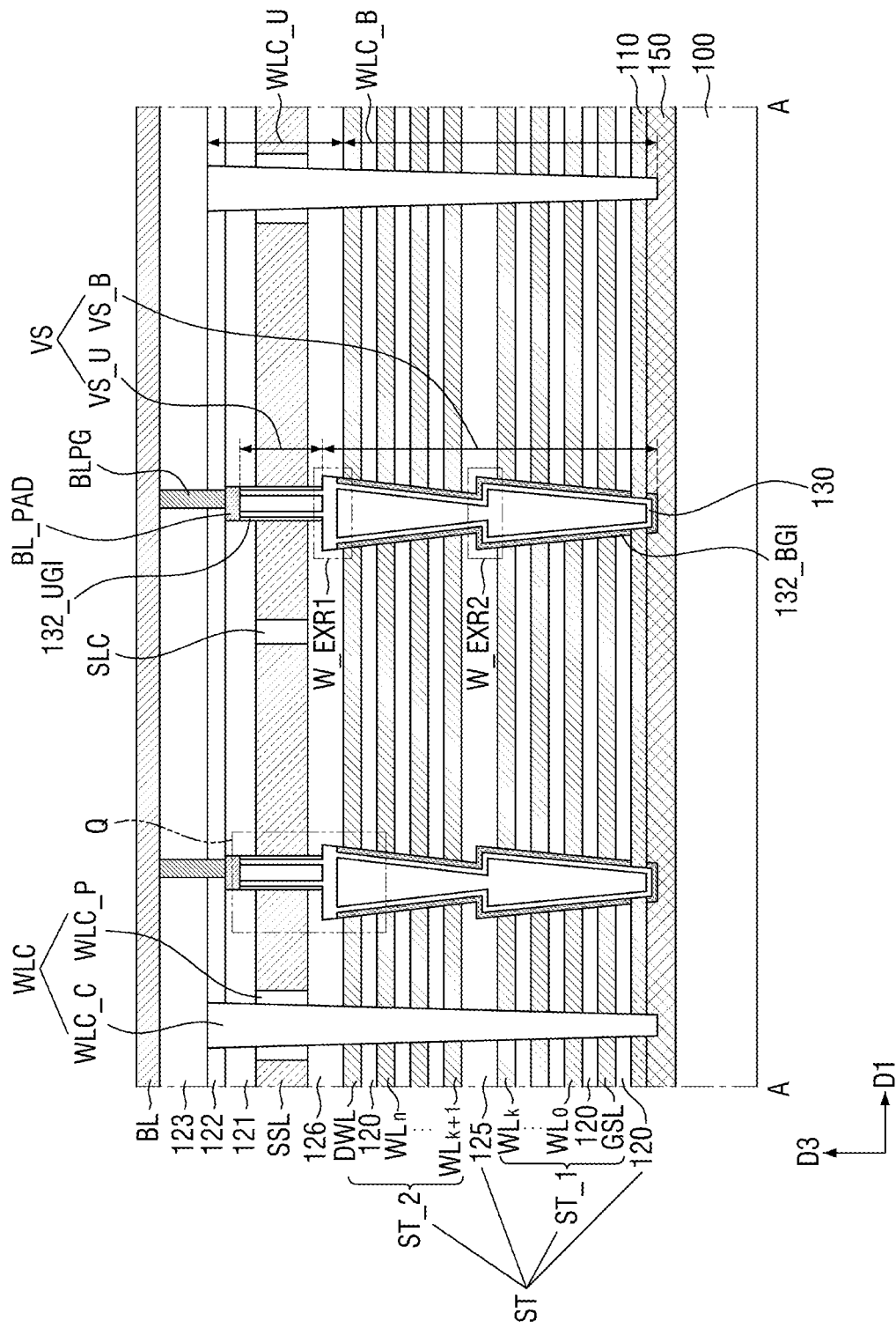
FIGS. 10 and 11 are diagrams of a semiconductor memory device according to some embodiments.
Figure 11:
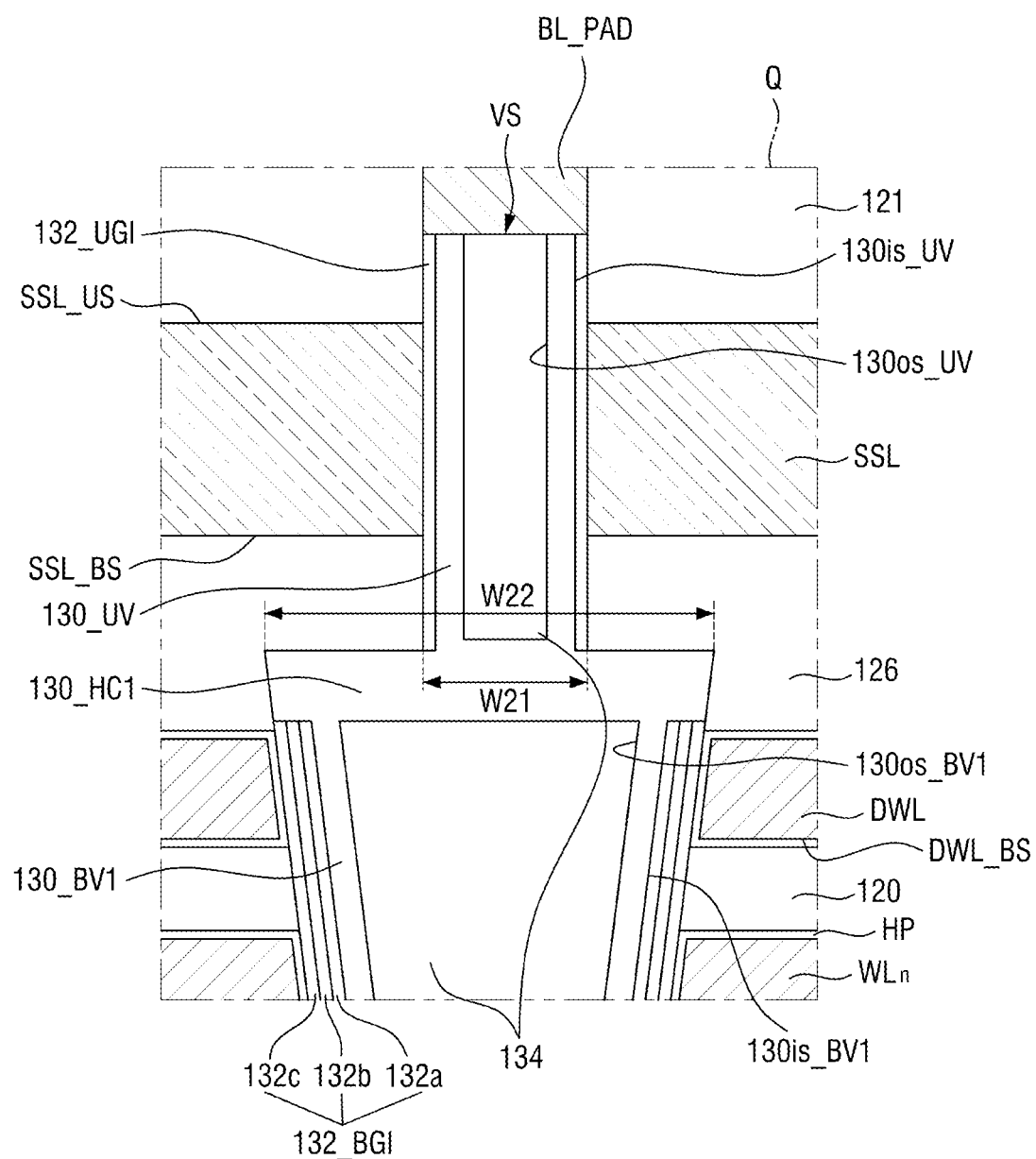

FIGS. 10 and 11 are diagrams for explaining a semiconductor memory device according to some embodiments. For convenience of explanation, differences from those described using FIGS. 2 to 8 will be mainly described. For reference, FIG. 11 is an enlarged view of part Q of FIG. 10.

Referring to FIGS. 10 and 11, in the semiconductor memory device according to some embodiments, the upper vertical channel film 130_UV and the first lower vertical channel film 130_BV1 may be directly connected to each other by the upper connection channel film 130_HC1 which divides the vertical insulation pattern 134 into two parts. The upper connection channel film 130_HC1 may cover the upper surface of the lower channel insulation film 132_BGI.

Figure 12:
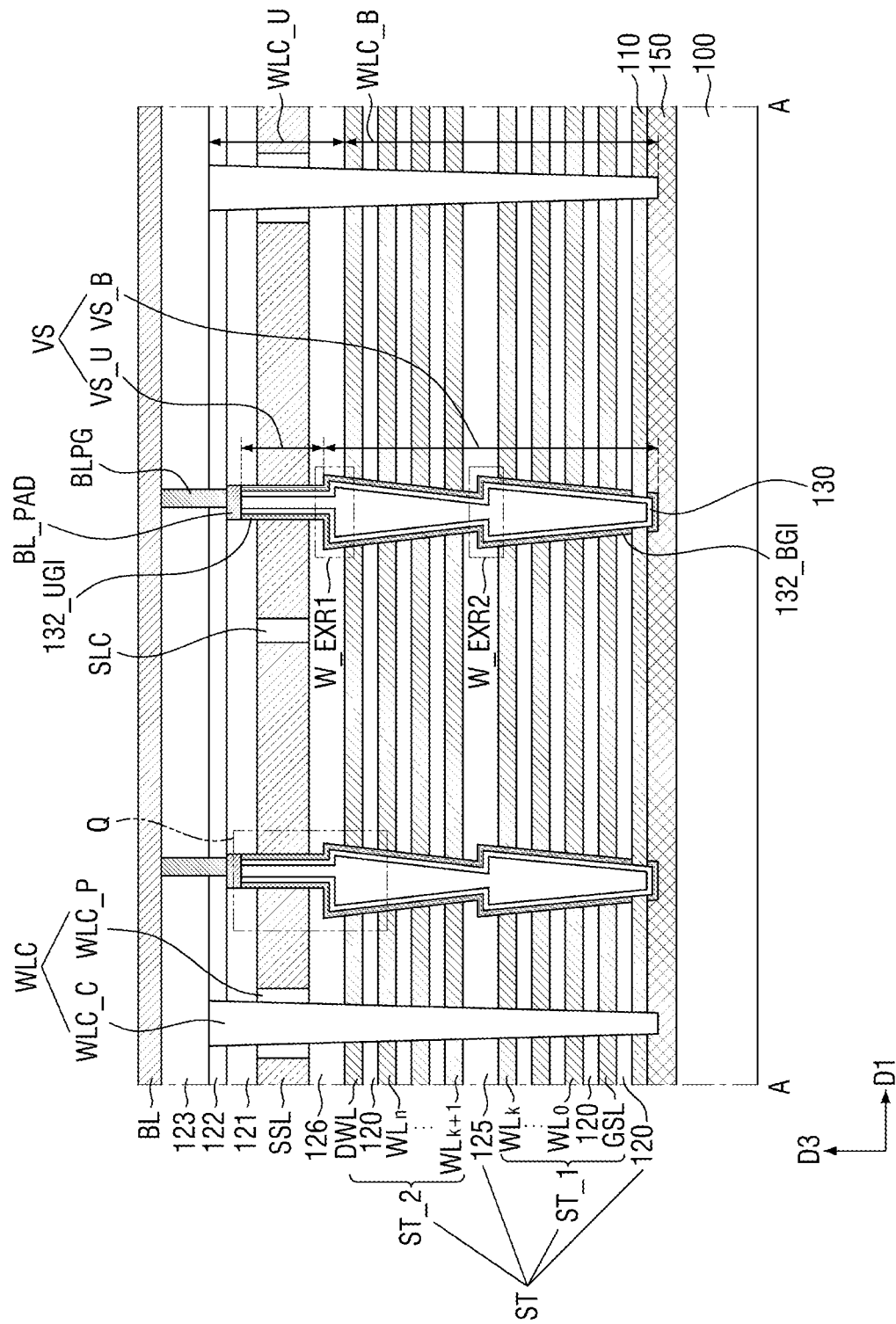
FIGS. 12 and 13 are diagrams of a semiconductor memory device according to some embodiments.
Figure 13:
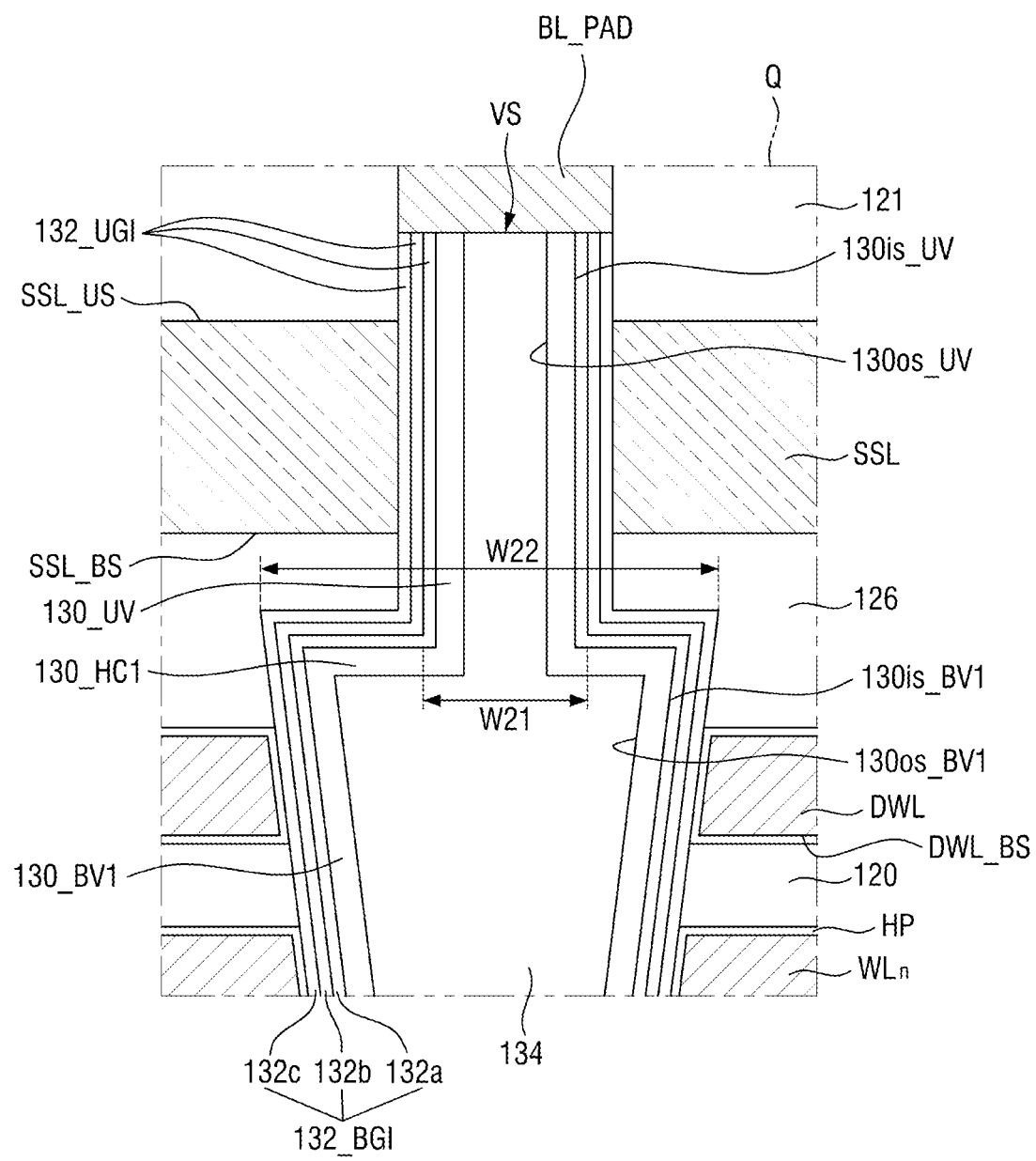

FIGS. 12 and 13 are diagrams for explaining a semiconductor memory device according to some embodiments. For convenience of explanation, differences from those described using FIGS. 2 to 8 will be mainly described. For reference, FIG. 13 is an enlarged view of part Q of FIG. 12.

Referring to FIGS. 12 and 13, in the semiconductor memory device according to some embodiments, the vertical insulation pattern 134 is not divided into two parts by the upper connection channel film 130_HC1. The stacked structure of the upper channel insulation film 132_UGI is the same as the structure of the lower channel insulation film 132_BGI. Since the upper channel insulation film 132_UGI and the lower channel insulation film 132_BGI are continuously formed along the profile of the vertical channel film 130, the upper channel insulation film 132_UGI and the lower channel insulation film 132_BGI are directly connected to each other.

Figure 14:
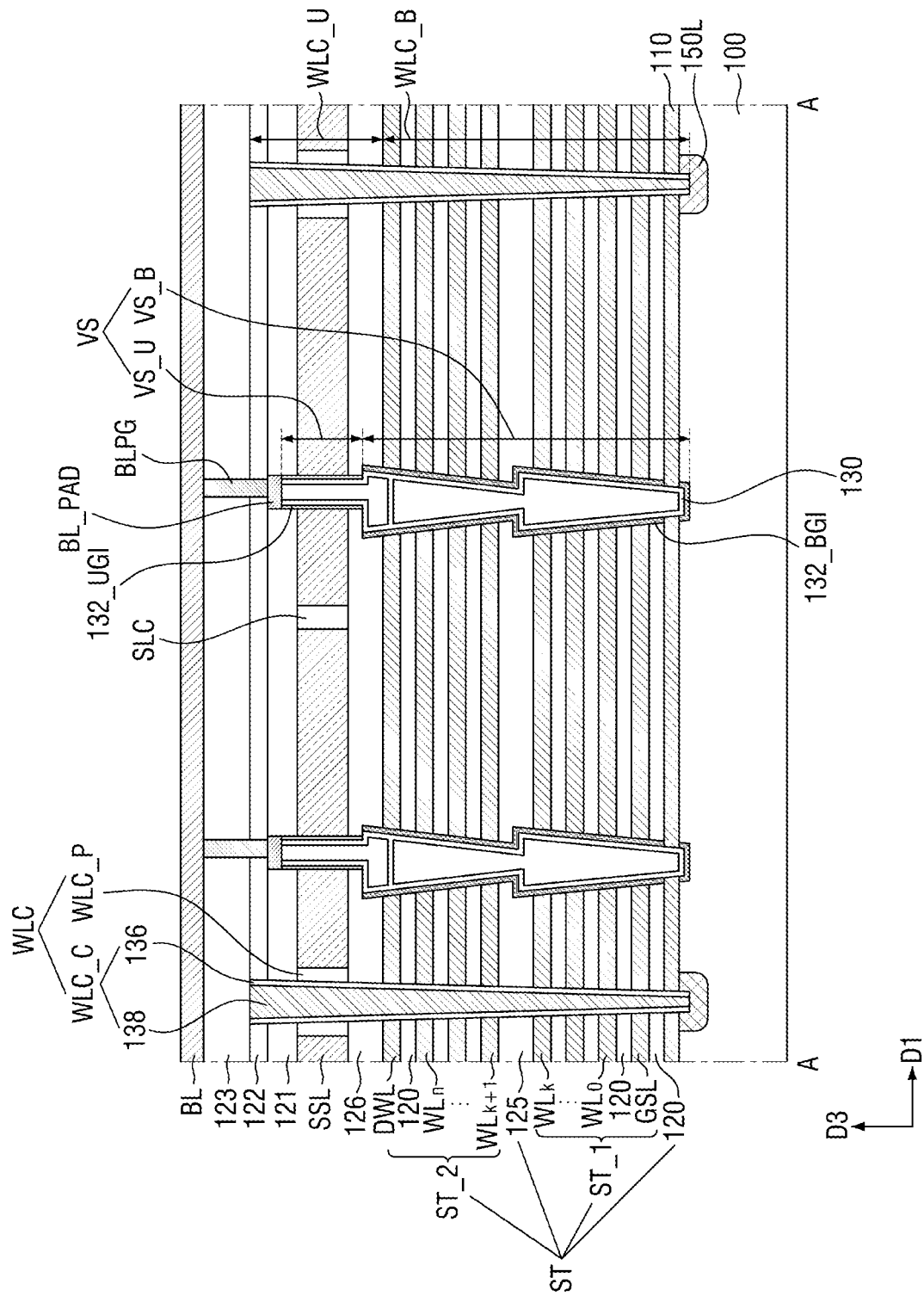
FIG. 14 is a diagram of a semiconductor memory device according to some embodiments.

FIG. 14 is a diagram for explaining the semiconductor memory device according to some embodiments. For convenience of explanation, differences from those described using FIGS. 2 to 8 will be mainly described.

Referring to FIG. 14, in the semiconductor memory device according to some embodiments, the core cutting line WLC_C may include a plug pattern 138 and a spacer 136.

The plug pattern 138 penetrates the semiconductor conduction line SSL and the stacked structure ST, and may be connected to the substrate 100. In some embodiments, the plug pattern 138 may be provided on the common source line CSL of the semiconductor memory device of FIG. 1. For example, the plug pattern 138 may include a conductive material. Further, the plug pattern 138 may be connected to an impurity region 150L in the substrate 100. The impurity region 150L may extend, e.g., in the second direction D2.

The spacer 136 may be interposed between the plug pattern 138 and the semiconductor conduction line SSL, and between the plug pattern 138 and the stacked structure ST. For example, the spacer 136 may extend along a side surface of the plug pattern 138. The spacer 136 may include an insulation material. Accordingly, the plug pattern 138 may be spaced apart from the semiconductor conduction line SSL and the metallic lines GSL, $WL_0$ to $WL_n$ and DWL of the stacked structure ST.

Figure 15:
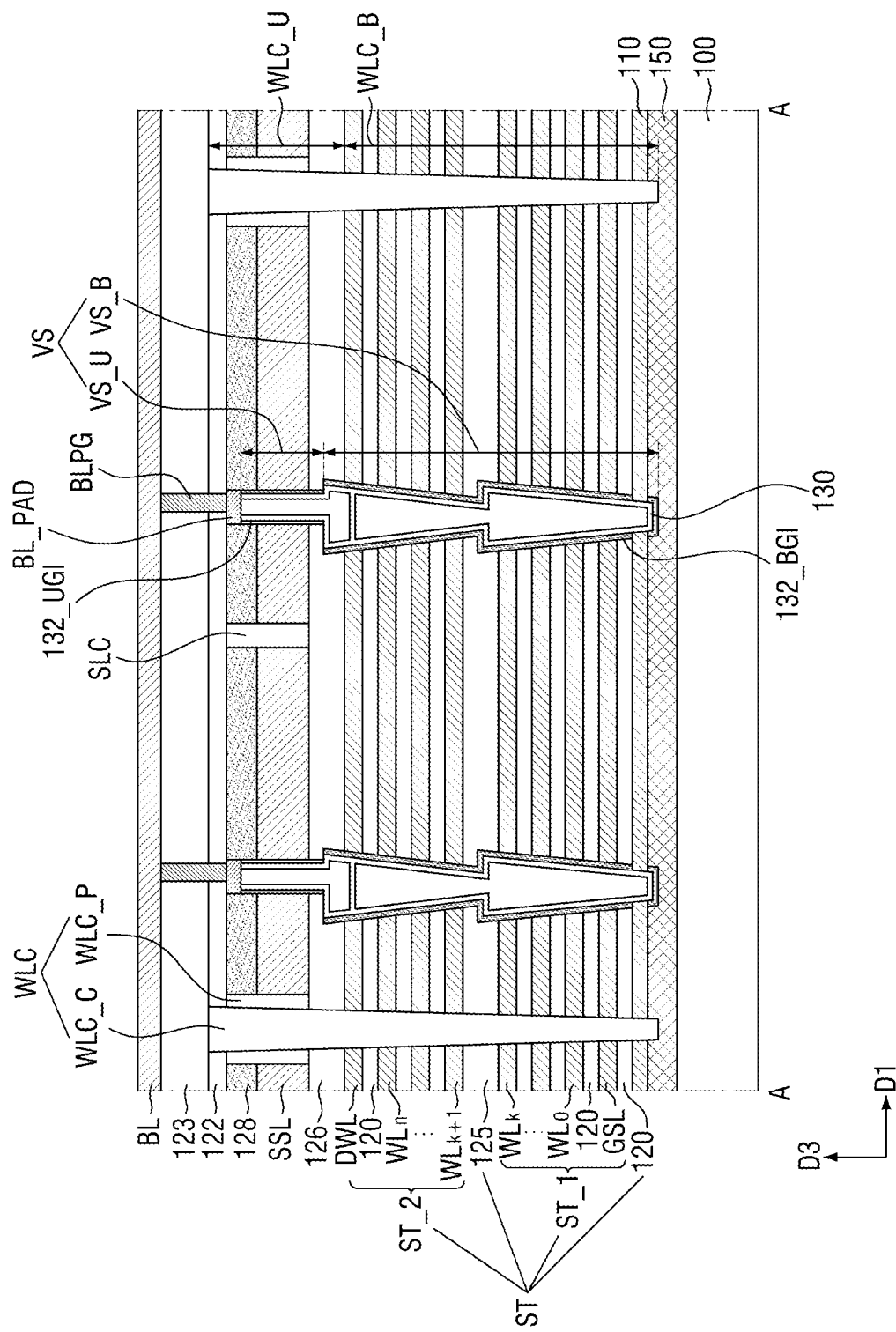
FIGS. 15 and 16 are diagrams of a semiconductor memory device according to some embodiments.
Figure 16:
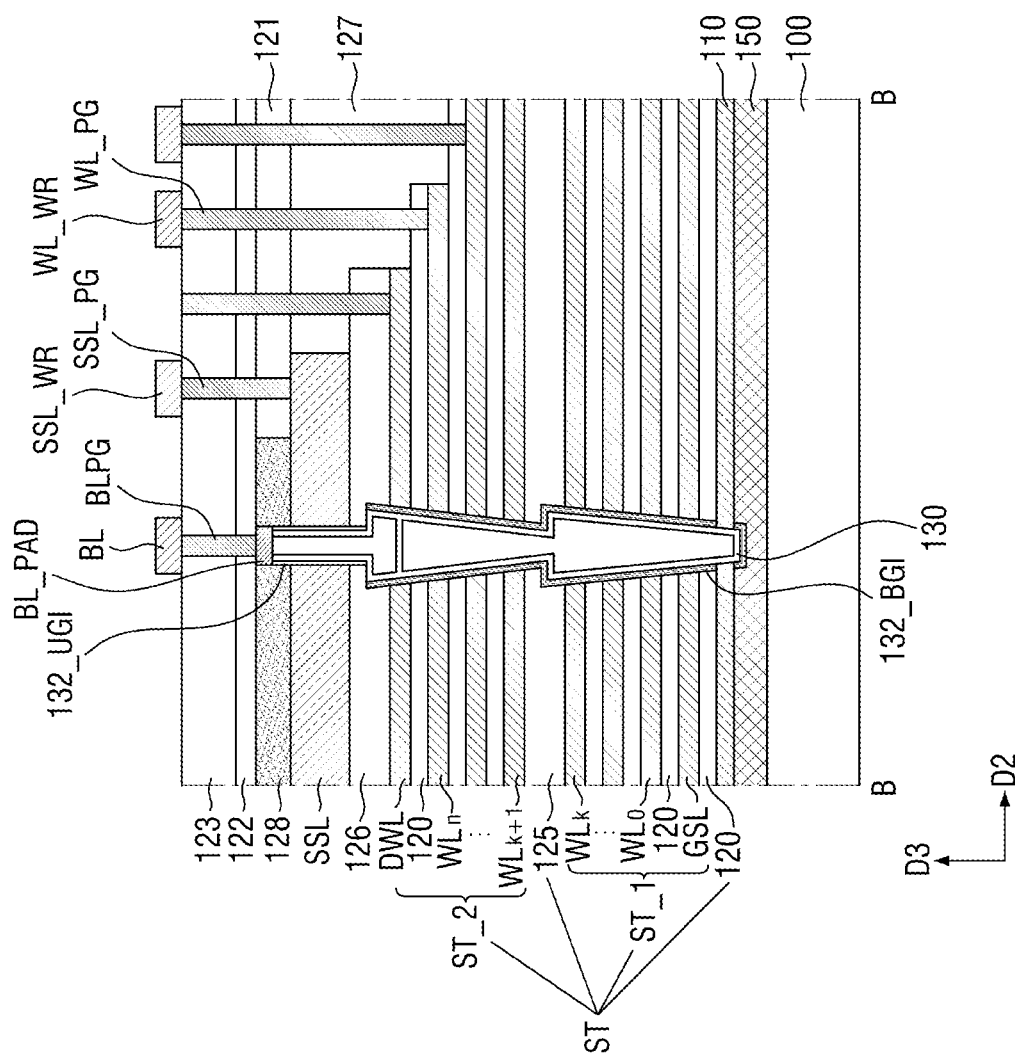

FIGS. 15 and 16 are diagrams for explaining the semiconductor memory device according to some embodiments. For convenience of explanation, differences from those described using FIGS. 2 to 8 will be mainly described.

For reference, FIG. 15 is a cross-sectional view taken along a line A-A of FIG. 2, and FIG. 16 is a cross-sectional view taken along a line B-B of FIG. 2.

Referring to FIGS. 15 and 16, the semiconductor memory device according to some embodiments may further include a punching prevention film 128 placed between the second interlayer insulation film 122 and the semiconductor conduction line SSL. For example, the punching prevention film 128 may be in contact with the semiconductor conduction line SSL. The punching prevention film 128 may extend along the upper surface SSL_US of the semiconductor conduction line.

As an example, the upper surface of the punching prevention film 128 may be placed on the same plane as the upper surface of the bit line pad BL_PAD. Unlike the shown one, the upper surface of the bit line pad BL_PAD may protrude upward from the upper surface of the punching prevention film 128.

The cutting line WLC may penetrate the punching prevention film 128. The core cutting line WLC_C penetrates the second interlayer insulation film 122 and the punching prevention film 128, and passes through the word line cutting opening (SSL_WH of FIG. 4) included in the semiconductor conduction line SSL. The core cutting line WLC_C is not in contact with the punching prevention film 128.

The sidewall cutting line WLC_P may be placed between the core cutting line WLC_C and the semiconductor conduction line SSL, and between the core cutting line WLC_C and the punching prevention film 128. In the fabricating process, since the punching prevention film 128 is also cut in the second direction D2 while the word line cutting opening SSL_WH is formed, the word line cutting opening SSL_WH may extend to the upper surface of the punching prevention film 128. The sub-cutting line SLC may extend to the upper surface of the punching prevention film 128.

In FIG. 16, the punching prevention film 128 may be stacked on the semiconductor conduction line SSL in a stepwise form. That is, a part of the semiconductor conduction line SSL is not covered by the punching prevention film 128.

The punching prevention film 128 includes a material different from that of the second interlayer insulation film 122. The punching prevention film 128 includes a material having etching resistance higher than that of the second interlayer insulation film 122. For example, if the second interlayer insulation film 122 includes silicon oxide, the punching prevention film 128 may include, e.g., silicon nitride.

If the bit line plug BLPG is misaligned during the process of forming the bit line plug BLPG, the bit line plug BLPG may be electrically connected to the semiconductor conduction line SSL. The punching prevention film 128 may prevent the connection between the bit line plug BLPG and the semiconductor conduction line SSL.

Figure 17:
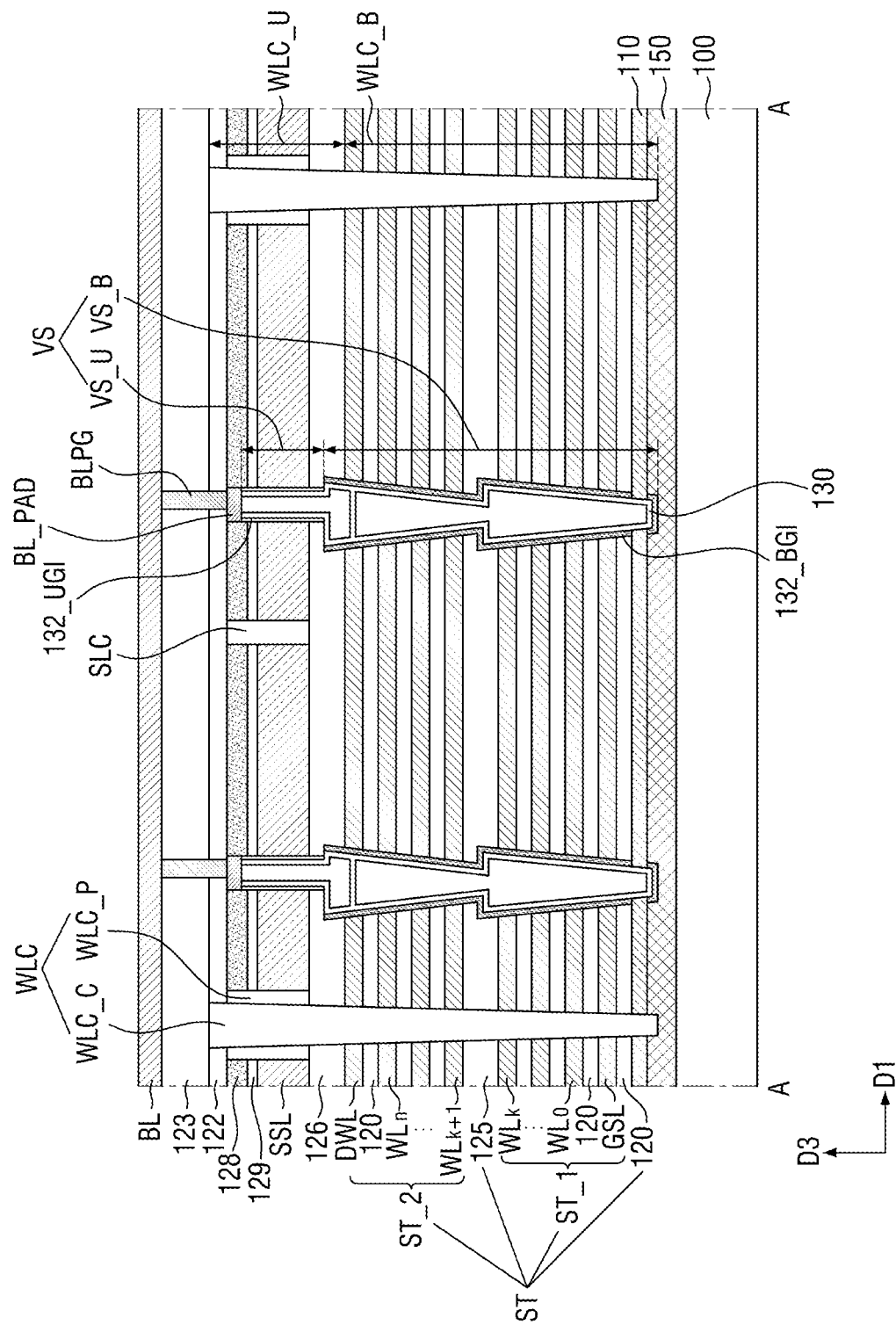
FIG. 17 is a diagram for explaining the semiconductor memory device according to some embodiments.

FIG. 17 is a diagram for explaining the semiconductor memory device according to some embodiments. For convenience of explanation, differences from those described using FIGS. 15 and 16 will be mainly described.

Referring to FIG. 17, the semiconductor memory device according to some embodiments may further include an insertion insulation film 129 placed between the punching prevention film 128 and the semiconductor conduction line SSL. The semiconductor conduction line SSL is not in contact with the punching prevention film 128. The insertion insulation film 129 includes a material different from that of the punching prevention film 128.

Figure 18:
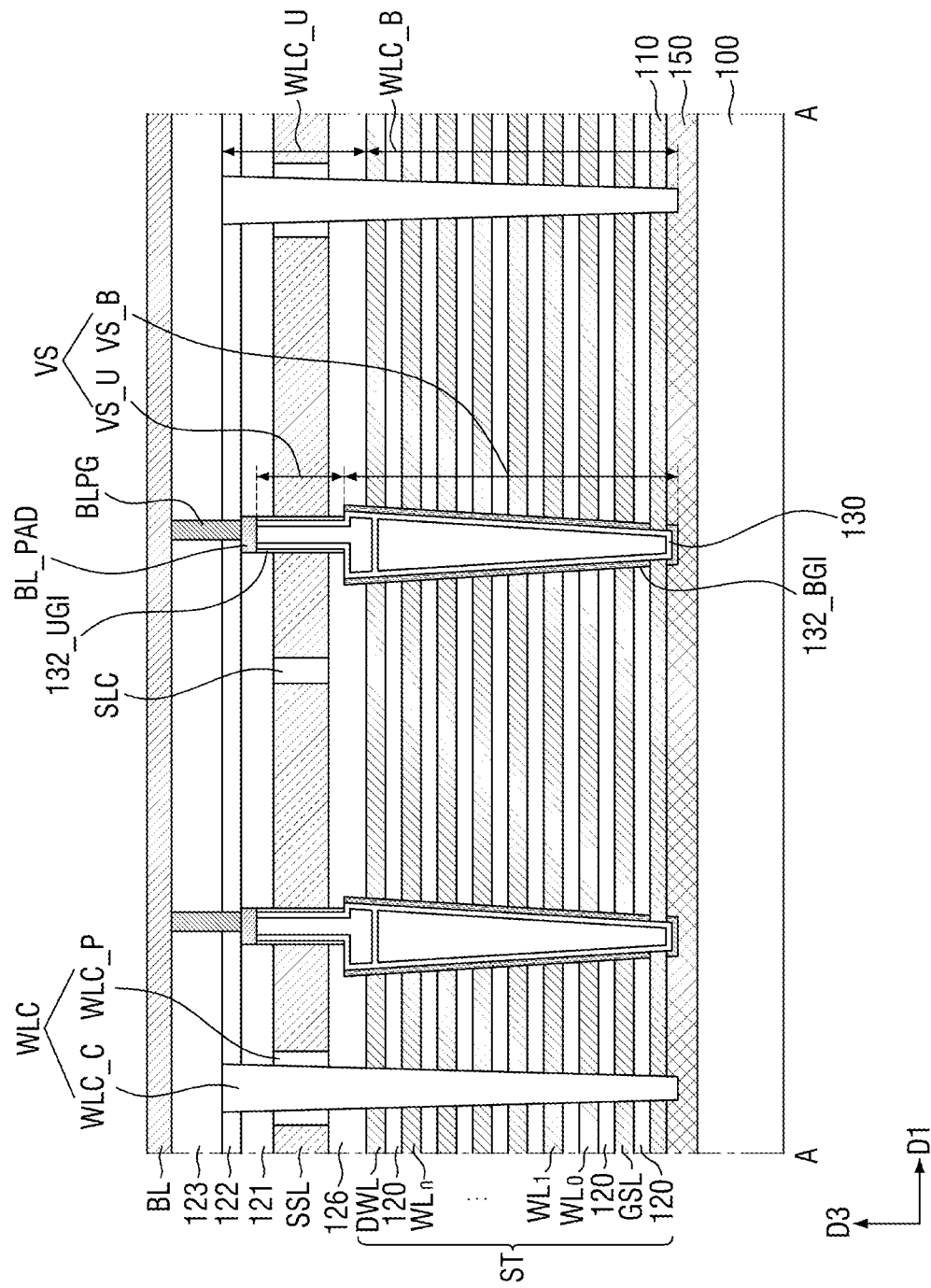
FIG. 18 is a diagram of a semiconductor memory device according to some embodiments.
Figure 19:
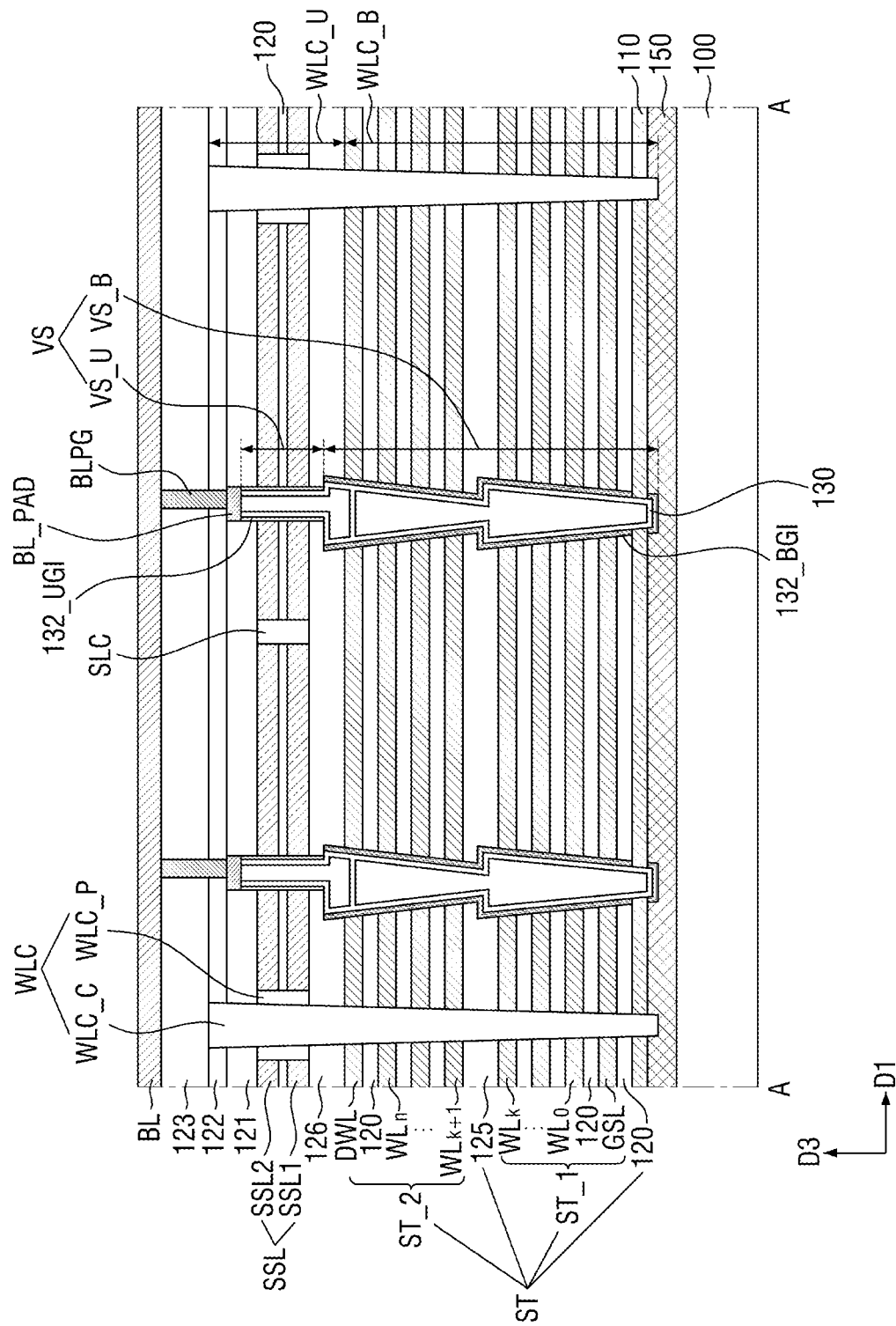
FIG. 19 is a diagram of a semiconductor memory device according to some embodiments.

FIG. 18 is a diagram for explaining a semiconductor memory device according to some embodiments. FIG. 19 is a diagram for explaining the semiconductor memory device according to some embodiments. For convenience of explanation, differences from those described using FIGS. 2 to 8 will be mainly described.

Referring to FIG. 18, in the semiconductor memory device according to some embodiments, a lower vertical structure VS_B may not include a width extension region in which a width extends in the first direction D1 within the stacked structure ST. The vertical structure VS_B may gradually decrease in width in the first direction D1 as the vertical structure VS_B goes away from the bit line pad BL_PAD. The vertical structure VS may include only a first width extension region W_EXR1 defined between the semiconductor conduction line SSL and the stacked structure ST.

Referring to FIG. 19, in the semiconductor memory device according to some embodiments, the semiconductor conduction line SSL includes a lower semiconductor conduction line SSL1 and an upper semiconductor conduction line SSL2 that are sequentially stacked in the third direction D3. The lower semiconductor conduction line SSL1 and the upper semiconductor conduction line SSL2 may be spaced apart from each other in the third direction D3. The upper semiconductor conduction line SSL2 is closer to the bit line pad BL_PAD than the lower semiconductor conduction line SSL1.

An inter-electrode insulation film 120 may be placed between the lower semiconductor conduction line SSL1 and the upper semiconductor conduction line SSL2. As an example, the lower semiconductor conduction line SSL1 and the upper semiconductor conduction line SSL2 serve as the string selection line of FIG. 1, and may be included in the string selection transistor SST. As another example, the lower semiconductor conduction line SSL1 may serve as the string selection line of FIG. 1. Although it is not shown in FIG. 1, the upper semiconductor conduction line SSL2 may also serve as the erasing control line included in the erasing control transistor. As still another example, some parts of the lower semiconductor conduction line SSL1 and the upper semiconductor conduction line SSL2 may serve as the string selection line of FIG. 1. Although it is not shown in FIG. 1, the remainder of the upper semiconductor conduction line SSL2 may also serve as the erasing control line included in the erasing control transistor.

Figure 20:
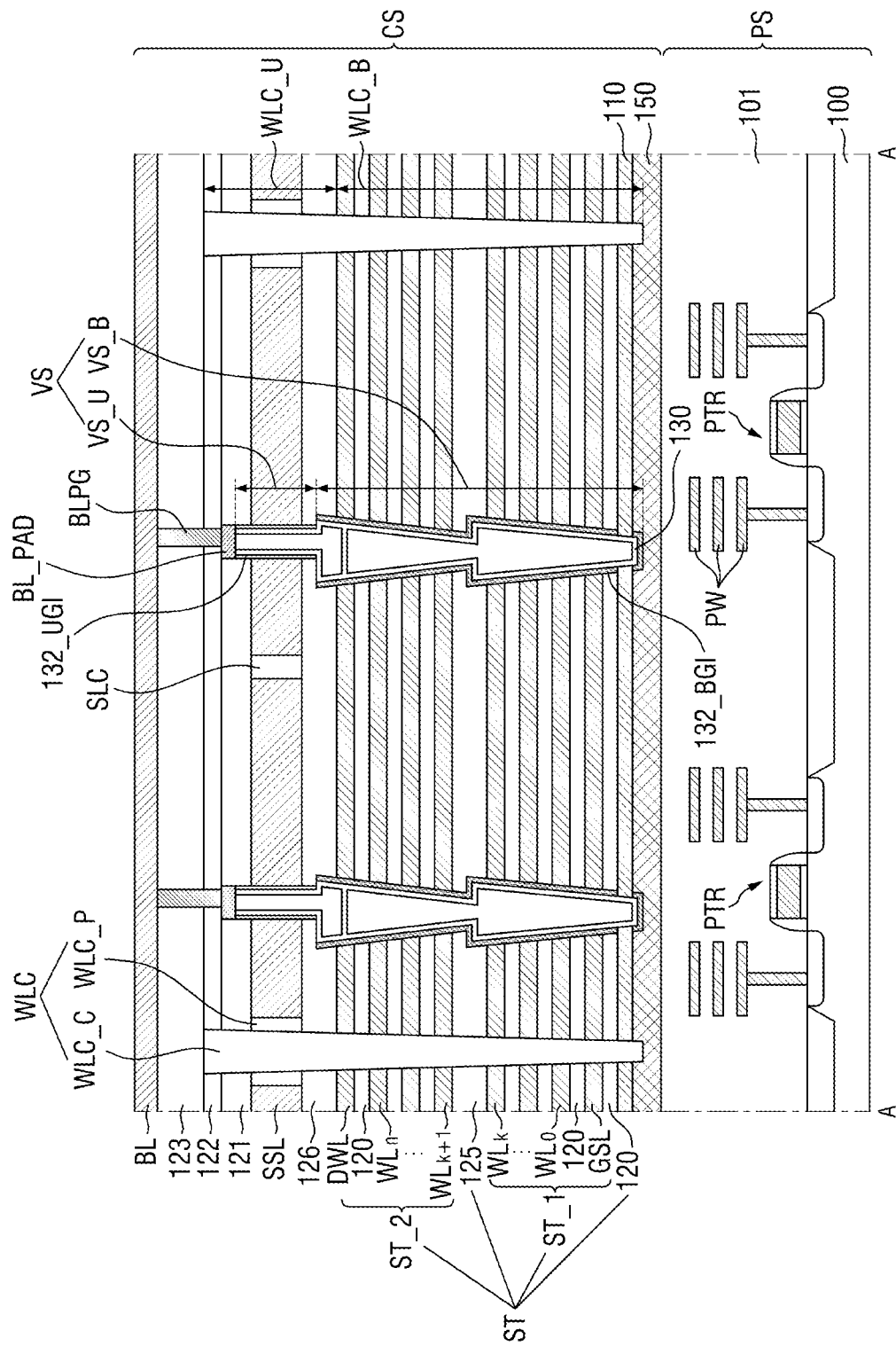
FIG. 20 is a diagram of a semiconductor memory device according to some embodiments.

FIG. 20 is a diagram for explaining the semiconductor memory device according to some embodiments. For convenience of explanation, differences from those described using FIGS. 2 to 8 will be mainly described.

Referring to FIG. 20, the semiconductor memory device according to some embodiments may include a peripheral logic structure PS and a cell array structure CS. The peripheral logic structure PS may include a peripheral circuit PTR, a lower connection wiring body PW, and a peripheral logic insulation film 101. The peripheral circuit PTR may be formed on the substrate 100. The peripheral circuit PTR may be circuits for operating the cell array structure CS.

The peripheral logic insulation film 101 may be formed on the substrate 100. The peripheral logic insulation film 101 may include at least one of, e.g., silicon oxide, silicon nitride, silicon oxynitride, and a low-dielectric constant material.

The lower connection wiring body PW may be formed in the peripheral logic insulation film 101. The lower connection wiring body PW may be connected to the peripheral circuit PTR.

The cell array structure CS may be placed on the peripheral logic structure PS. The cell array structure CS may include a lower stacked structure ST, a semiconductor conduction line SSL, a plurality of vertical structures VS, a cutting line WLC, and a plurality of bit lines BL.

The horizontal conductive substrate 150 may extend along the upper surface of the peripheral logic structure PS.

Figure 21:
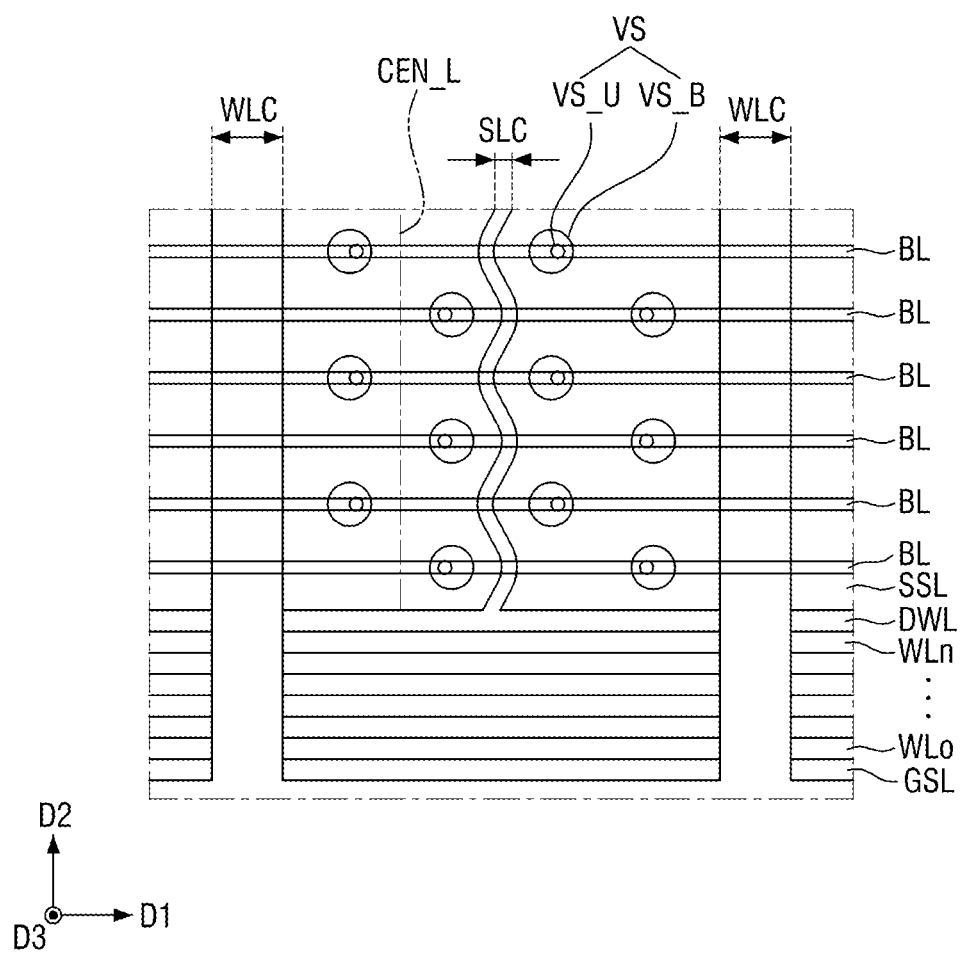
FIG. 21 is a layout diagram of a nonvolatile memory device according to some embodiments.
Figure 22:
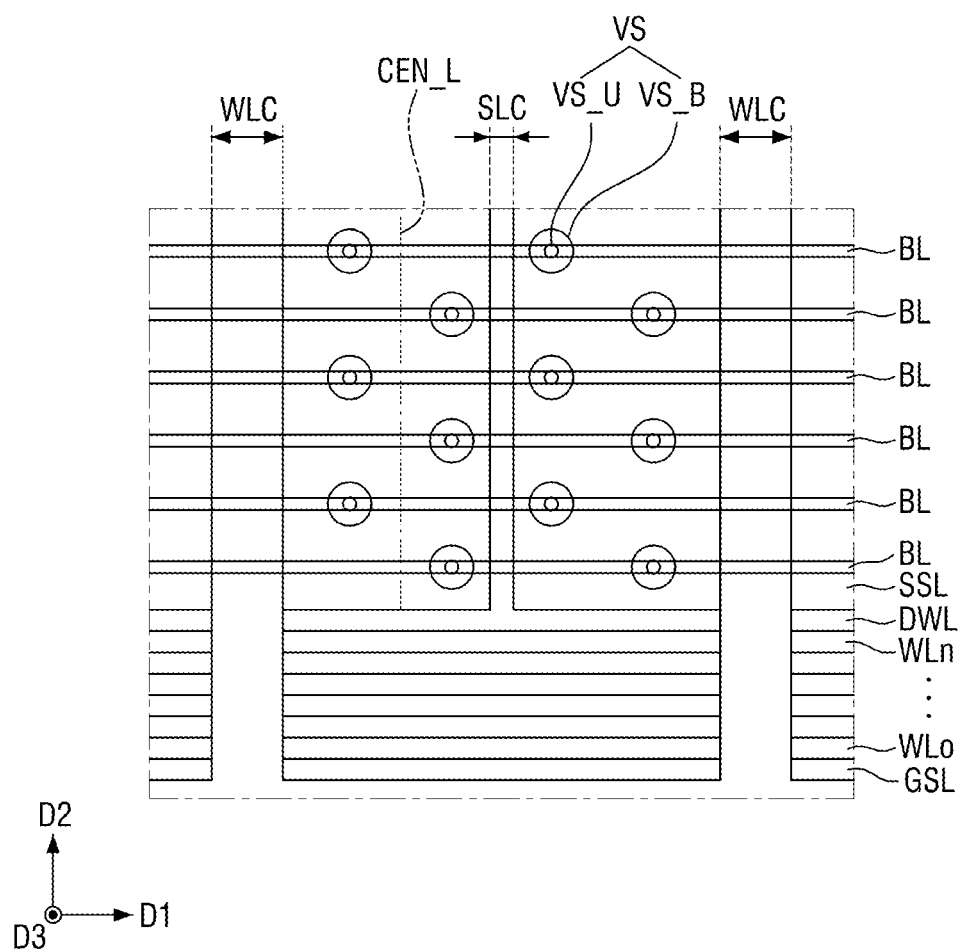
FIG. 22 is a layout diagram of a nonvolatile memory device according to some embodiments.
Figure 23:
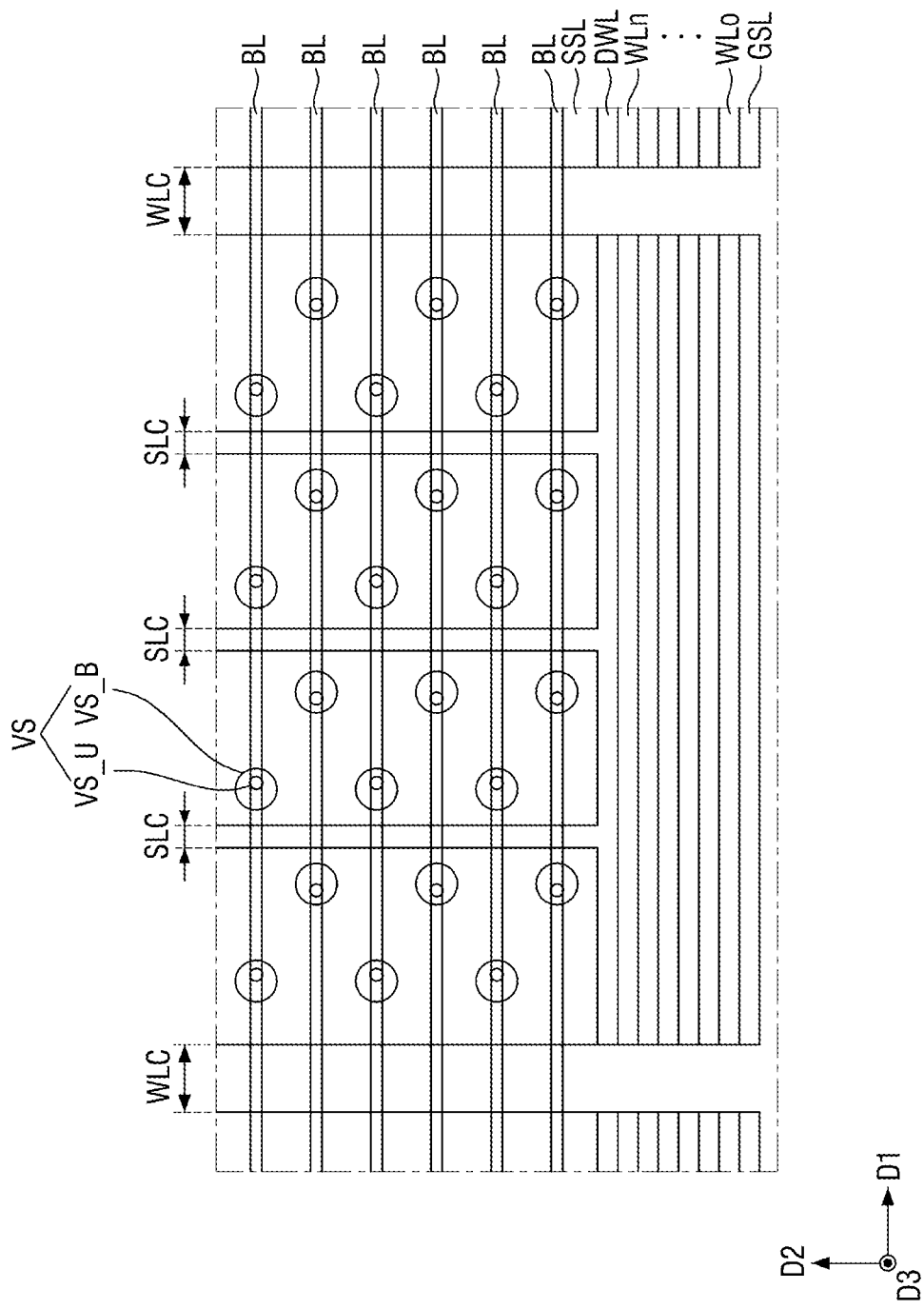
FIG. 23 is a layout diagram of a nonvolatile memory device according to some embodiments.

FIG. 21 is a layout diagram for explaining a nonvolatile memory device according to some embodiments. FIG. 22 is a layout diagram for explaining a nonvolatile memory device according to some embodiments. FIG. 23 is a layout diagram for explaining a nonvolatile memory device according to some embodiments. For convenience of explanation, differences from those described using FIGS. 2 to 8 will be mainly described.

Referring to FIG. 21, in the semiconductor memory device according to some embodiments, the sub-cutting line SLC may have a wavy form extending in the second direction D2.

Referring to FIG. 22, in the semiconductor memory device according to some embodiments, the center of the upper vertical structure VS_U may coincide with the center of the lower vertical structure VS_B.

Referring to FIG. 23, in the semiconductor memory device according to some embodiments, a plurality of sub-cutting lines SLC may be placed between adjacent cutting lines WLC. Since the plurality of sub-cutting lines SLC is placed, the semiconductor conduction line SSL may be divided into three or more sub-semiconductor conduction lines. Although it is shown that the three sub-cutting lines SLC are placed between the adjacent cutting lines WLC, this is only for convenience of explanation, and the embodiment is not limited thereto.

FIGS. 24 to 30 are intermediate stage diagrams for explaining a method of manufacturing a semiconductor memory device according to some embodiments.

Figure 24:
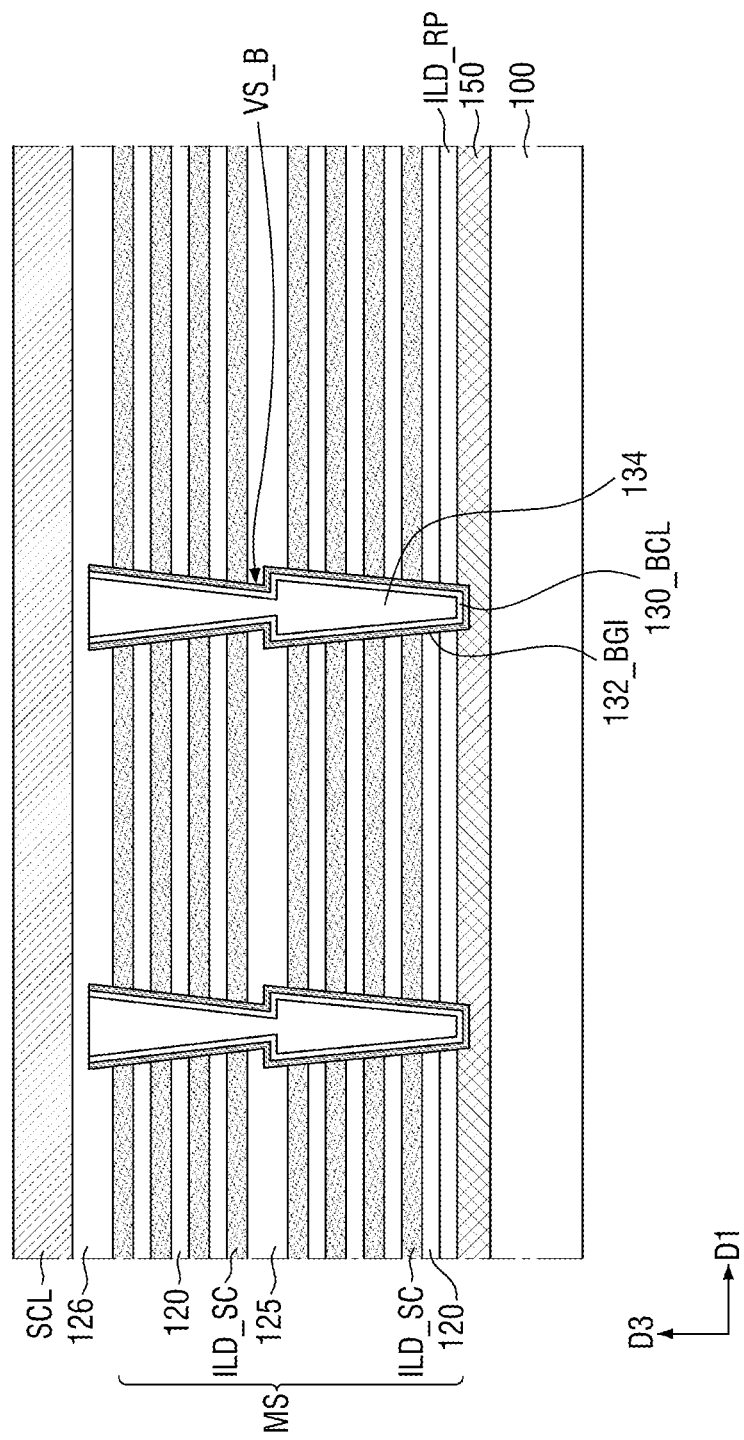
FIGS. 24 to 30 are intermediate stage diagrams of a semiconductor memory device according to some embodiments.

Referring to FIG. 24, the horizontal conductive substrate 150 and an alternative insulation film ILD_RP may be sequentially formed on the substrate 100. A mold structure MS in which the inter-electrode insulation films 120 and 125 and the sacrificial insulation film ILD_SC are alternately stacked may be formed on the alternative insulation film ILD_RP.

Next, a lower vertical structure VS_B including the lower channel film 130_BCL may be formed in the mold structure MS. The lower channel film 130_BCL may include the first lower vertical channel film 130_BV1, the second lower vertical channel film 130_BV2, and the lower connection channel film 130_HC2 described in FIGS. 5A to 6.

More specifically, a part of the mold structure MS in which the inter-electrode insulation film 120 and the sacrificial insulation film ILD_SC are alternately stacked may be formed on the alternative insulation film ILD_RP. Next, after forming the first lower channel hole for forming the lower vertical structure VS_B, the sacrificial pattern may fill the first lower channel hole.

After forming the sacrificial pattern, the remainder of the mold structure MS in which the inter-electrode insulation films 120 and 125 and the sacrificial insulation film ILD_SC are alternately stacked may be formed. Next, a second lower channel hole, which vertically overlaps the first lower channel hole and exposes the sacrificial pattern in the first lower channel hole, may be formed in the remainder of the mold structure MS.

After removing the sacrificial pattern in the first lower channel hole, a lower channel film 130_BCL and a vertical insulation pattern 134 may be formed in the first lower channel hole and the second lower channel hole. A lower channel insulation film 132_BGI is formed between the lower channel film 130_BCL and the mold structure MS. For example, the lower channel film 130_BCL may include a polycrystalline silicon film.

Accordingly, the lower vertical structure VS_B may be formed in the mold structure MS. Subsequently, the inter-structure insulation film 126 and the semiconductor film SCL may be formed on the mold structure MS having the lower vertical structure VS_B formed thereon.

Figure 25:
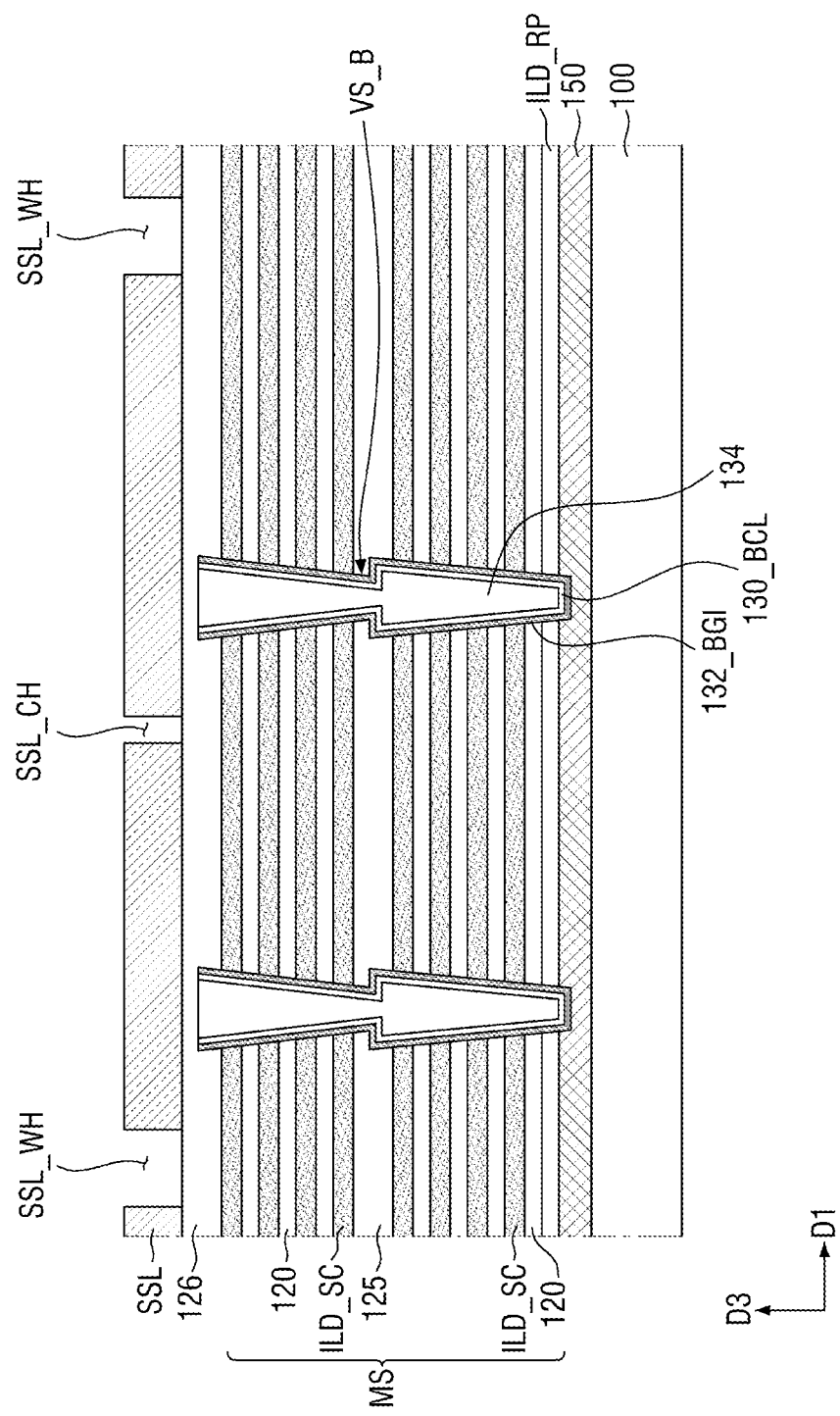

Referring to FIG. 25, the word line cutting opening SSL_WH may be formed in the semiconductor film SCL, and the semiconductor conduction line SSL may be formed on the mold structure MS. At least one or more selection line cutting openings SSL_CH may be formed between the adjacent word line cut openings SSL_WH. The word line cutting opening SSL_WH and the selection line cutting opening SSL_CH may be formed at the same time.

Figure 26:
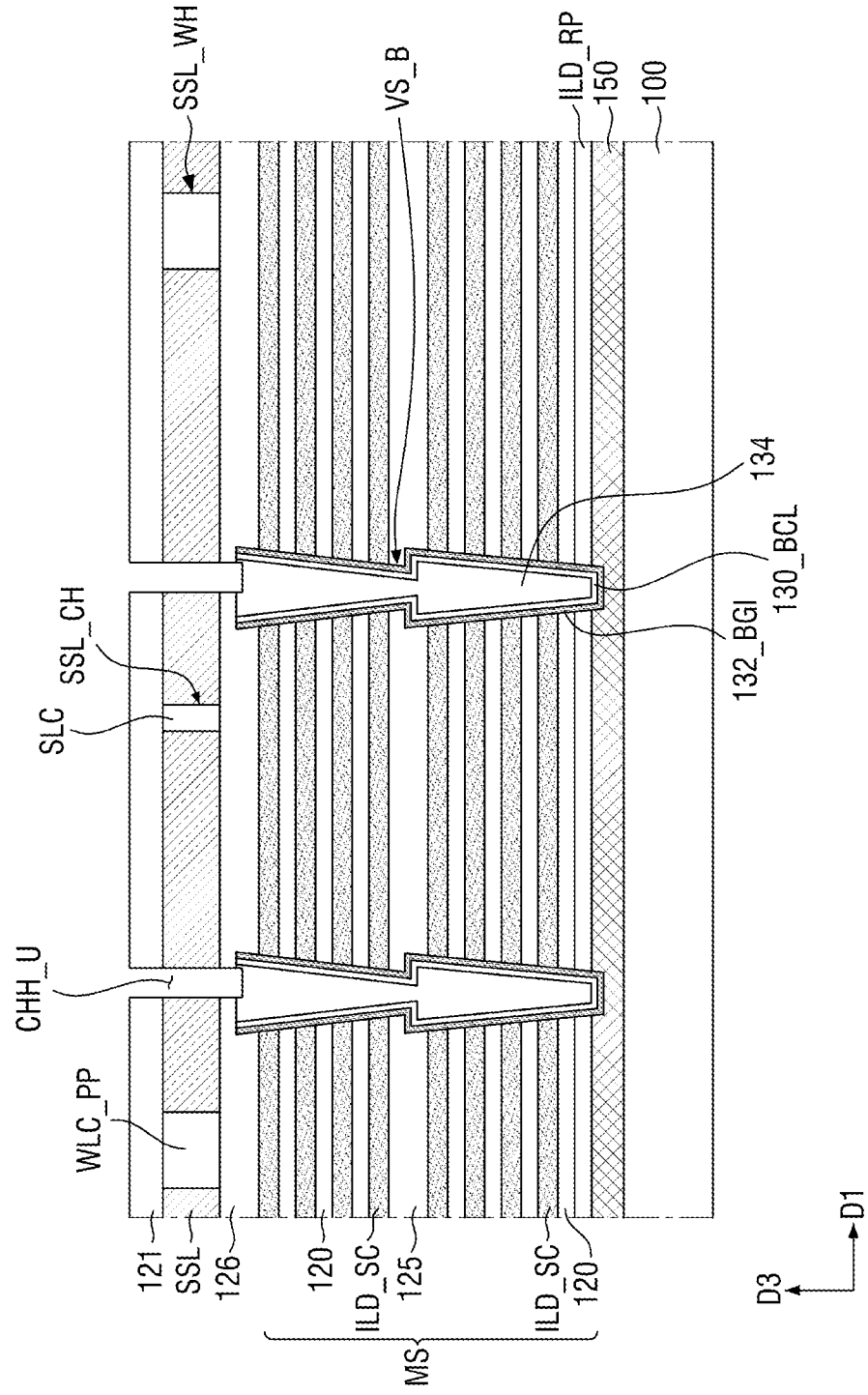

Referring to FIG. 26, a pre-sidewall cutting line WLC_PP that fills the word line cutting opening SSL_WH may be formed. A sub-cutting line SLC that fills the selection line cutting opening SSL_CH may be formed.

Further, the first interlayer insulation film 121 may be formed on the semiconductor conduction line SSL. As an example, in the process of forming the pre-sidewall cutting line WLC_PP and the sub-cutting line SLC, the first interlayer insulation film 121 may be formed. As another example, after forming the pre-sidewall cutting line WLC_PP and the sub-cutting line SLC, a first interlayer insulation film 121 which covers the semiconductor conduction line SSL, the pre-sidewall cutting line WLC_PP and the sub-cutting line SLC may be formed.

Next, an upper channel hole CHH_U may be formed in the semiconductor conduction line SSL. The upper channel hole CHH_U may expose the vertical insulation pattern 134 in the lower vertical structure VS_B.

The upper channel hole CHH_U may penetrate the semiconductor conduction line SSL and the first interlayer insulation film 121. The upper channel hole CHH_U may overlap the lower vertical structure VS_B in the third vertical direction D3. Unlike the shown one, a punching prevention film 128 may be formed on the semiconductor conduction line SSL.

Figure 27:
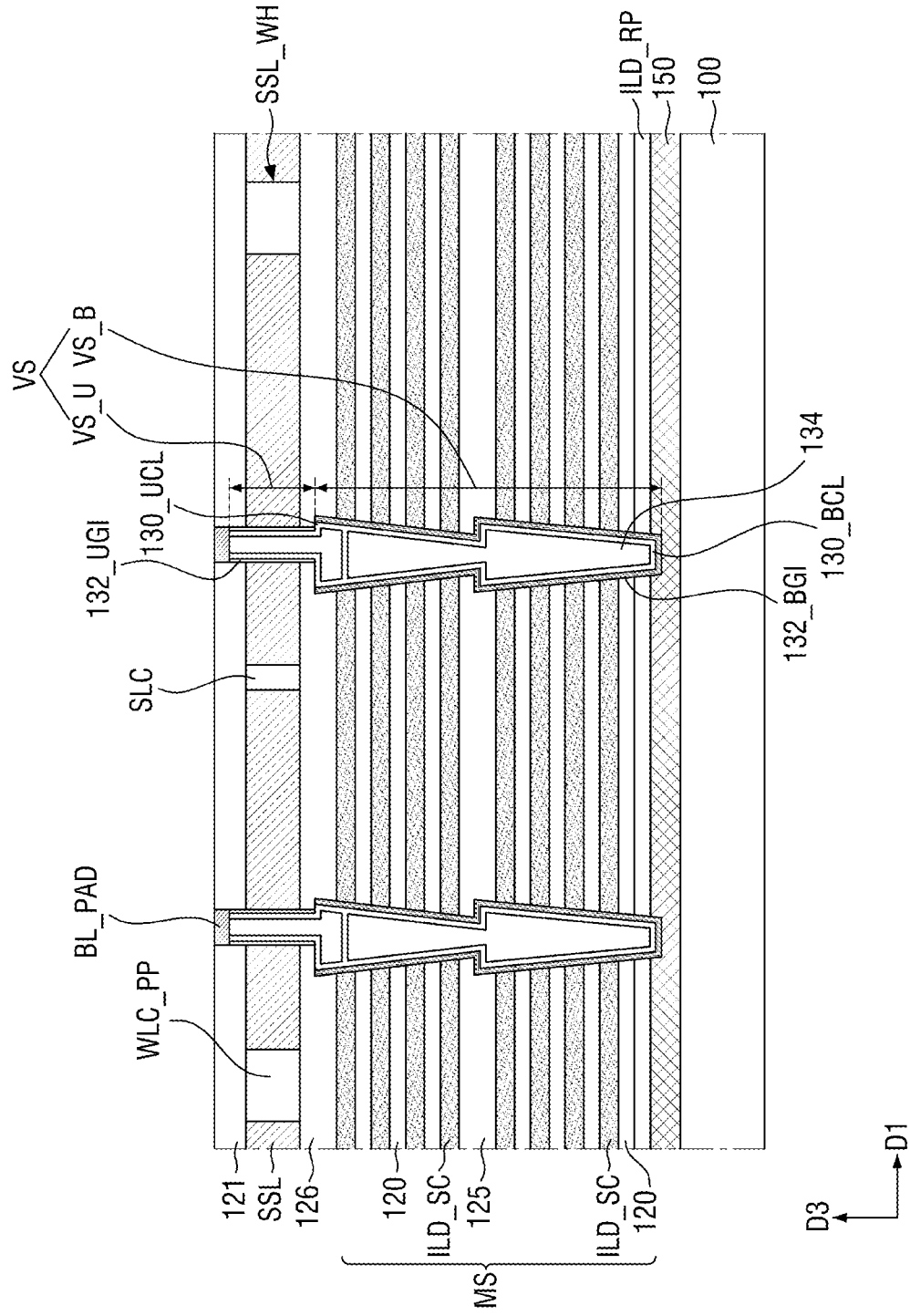

Referring to FIGS. 26 and 27, an upper channel insulation film 132_UGI may be formed along the sidewalls of the upper channel hole CHH_U. Sacrificial polysilicon may be formed along the upper channel insulation film 132_UGI.

Next, a part of the vertical insulation pattern 134 exposed by the upper channel hole CHH_U may be removed to form a space in the lower vertical structure VS_B. By removing a part of the vertical insulation pattern 134, a part of the lower channel film 130_BCL may be exposed.

After exposing a part of the lower channel film 130_BCL, the sacrificial polysilicon may be removed. While the sacrificial polysilicon is being removed, an exposed part of the lower channel film 130_BCL may also be removed.

Next, an upper channel film 130_UCL may be formed on the upper channel insulation film 132_UGI. The upper channel film 130_UCL may extend along the sidewalls of the upper channel hole CHH_U. The upper channel film 130_UCL may be connected to the lower channel film 130_BCL in the lower vertical structure VS_B.

The upper channel film 130_UCL may include a part of the first lower vertical channel film 130_BV1, the upper vertical channel film 130_UV, and the upper connection channel film 130_HC1 described in FIGS. 5A to 6. A vertical insulation pattern 134 that fills a part of the upper channel hole CHH_U may be formed on the upper vertical channel film 130_UCL.

Next, a bit line pad BL_PAD which is in contact with the upper channel film 130_UCL may be formed on the vertical insulation pattern 134 and the upper channel film 130_UCL.

Figure 28:
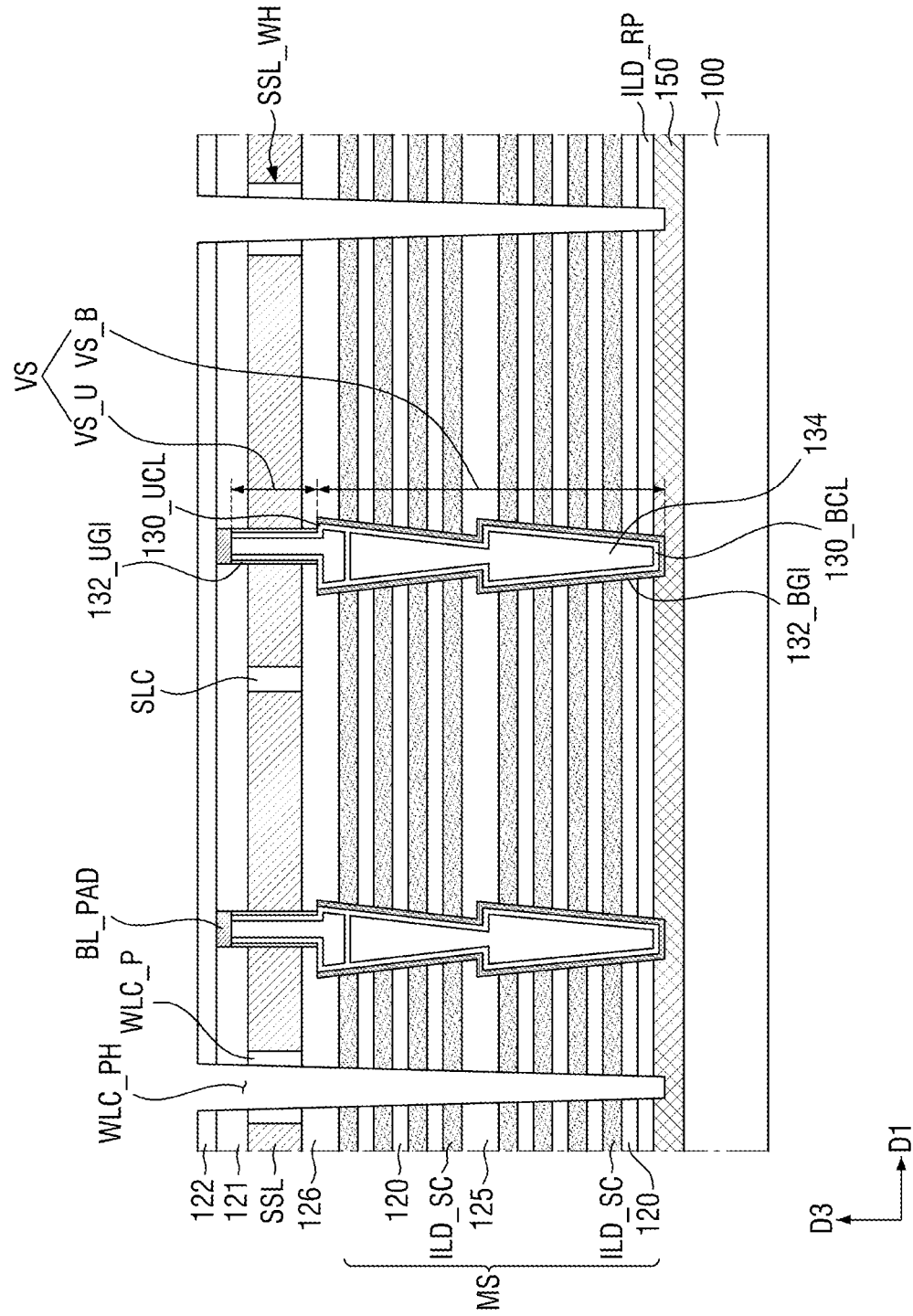

Referring to FIG. 28, a second interlayer insulation film 122 that covers the bit line pad BL_PAD may be formed on the first interlayer insulation film 121. Subsequently, a cutting line trench WCL_PH passing through the first and second interlayer insulation films 121 and 122 and the semiconductor conduction line SSL may be formed. The cutting line trench WCL_PH cuts the mold structure MS.

The cutting line trench WCL_PH may overlap the word line cutting opening SSL_WH in the third direction D3. The cutting line trench WCL_PH may cut the pre-sidewall cutting line WLC_PP in the word line cutting opening SSL_WH to form the sidewall cutting line WLC_P. The cutting line trench WCL_PH exposes the sacrificial insulation film ILD_SC and the alternative insulation film ILD_RP.

Figure 29:
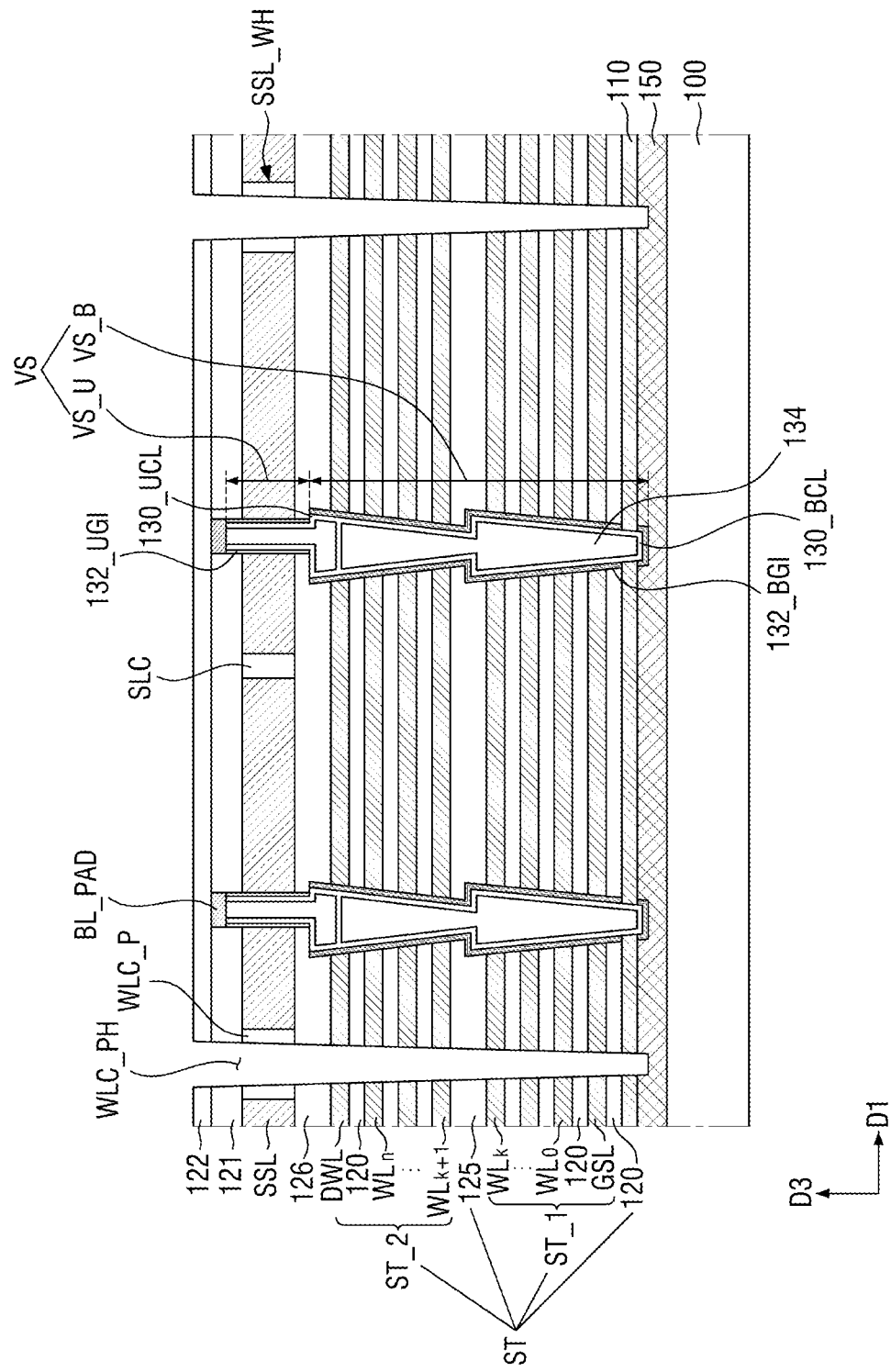

Referring to FIG. 29, the alternative insulation film ILD_RP exposed by the cutting line trench WCL_PH may be removed.

As an example, while the alternative insulation film ILD_RP is being removed, a part of the lower channel insulation film 132_BGI may be removed to expose the lower channel film 130_BCL. As another example, after removing the alternative insulation film ILD_RP, a part of the lower channel insulation film 132_BGI may be removed to expose the lower channel film 130_BCL.

A vertical structure support film 110 may be formed in the space from which the alternative insulation film ILD_RP is removed. Also, the sacrificial insulation film ILD_SC exposed by the cutting line trench WCL_PH may be removed. Metallic lines GSL, $WL_0$ to $WL_n$ and DWL may be formed in the space from which the sacrificial insulation film ILD_SC is removed. In other words, the sacrificial insulation film ILD_SC may be replaced with the metallic lines GSL, $WL_0$ to $WL_n$ and DWL through a replacement metal gate process using the cutting line trench WCL_PH.

Figure 30:
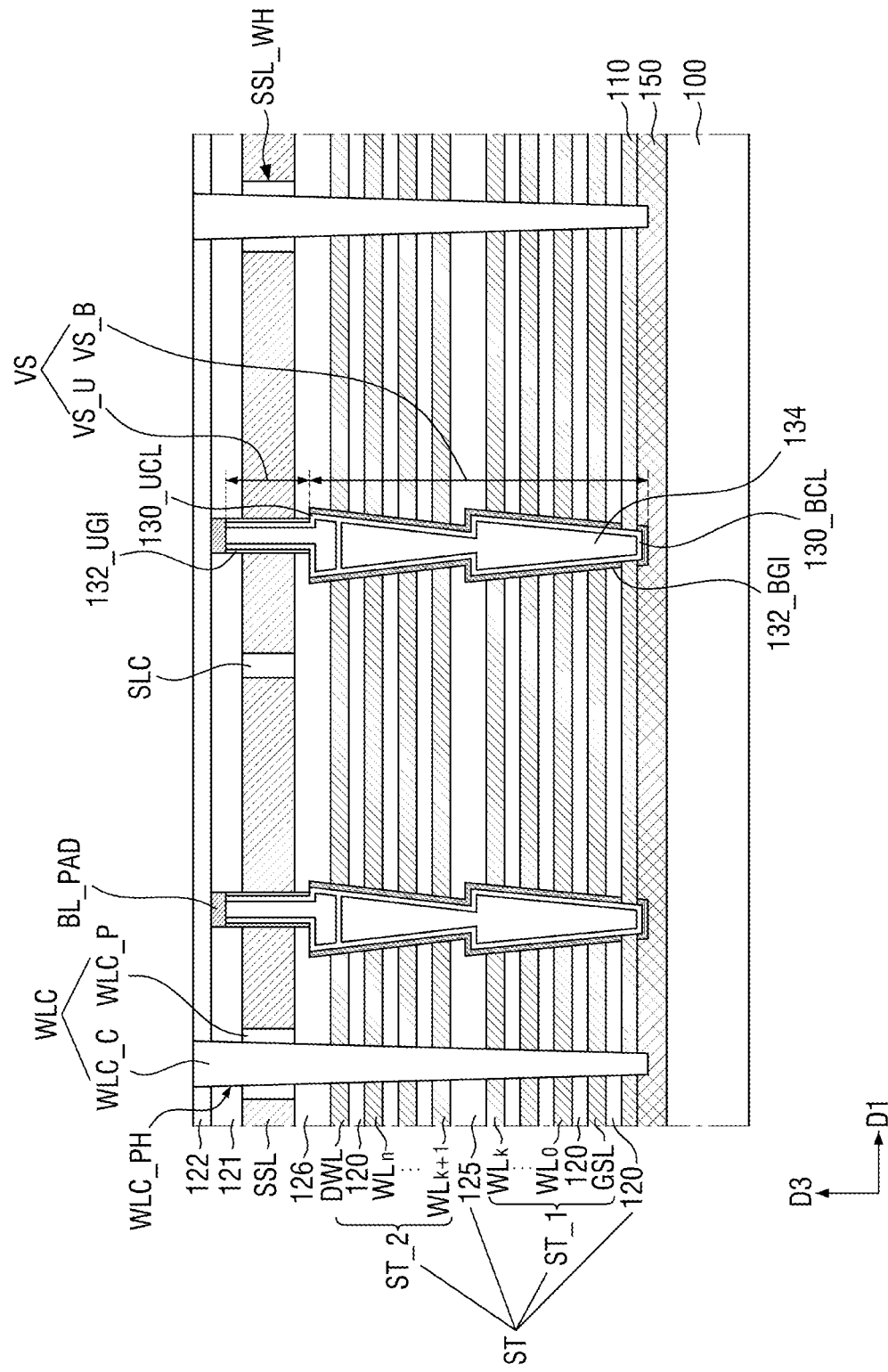

Referring to FIG. 30, the core cutting line WLC_C that fills the cutting line trench WCL_PH may be formed. Accordingly, a cutting line WLC including the core cutting line WLC_C and the sidewall cutting line WLC_P may be formed.

Referring to FIG. 3, the third interlayer insulation film 123 may be formed on the cutting line WLC and the second interlayer insulation film 122. The bit line BL may be formed on the third interlayer insulation film 123.

Unlike the aforementioned configuration, in FIG. 24, a lower vertical channel film 130_BCL which covers the upper surface of the vertical insulation pattern 134 may be additionally formed. In such a case, the channel film 130 as shown in FIGS. 10 and 11 may be formed.

Further, in FIG. 24, the lower vertical channel film 130_BCL may not be formed. In such a case, the vertical channel film 130 may be formed at once through the process described in FIG. 27. In such a case, a channel film 130 as shown in FIGS. 12 and 13 may be formed.

By way of summation and review, aspects of embodiments provide a semiconductor memory device including a vertical channel structure having improved element performance and degree of integration. Aspects of embodiments also provide a method of fabricating a semiconductor memory device including a vertical channel structure having improved element performance and degree of integration. That is, according to embodiments, the semiconductor conduction line SSL is removed in advance to form the sidewall cutting line WLC_P, thereby reducing the risk when etching word lines.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated.

Accordingly, it will be understood by those of skill in the art that various changes in form and details may be made without departing from the spirit and scope of the present invention as set forth in the following claims.

What is claimed is:

1. A semiconductor memory device, comprising:
a stacked structure including a plurality of metallic lines stacked in a first direction on a substrate, the plurality of metallic lines including an uppermost metallic line;
a semiconductor conduction line on the uppermost metallic line of the plurality of metallic lines, the semiconductor conduction line including a semiconductor material;
a vertical structure penetrating the semiconductor conduction line and the stacked structure, the vertical structure including a channel film, and the channel film including:
an upper channel film,
a first lower channel film extending in the first direction, and
an upper connection channel film connecting the upper channel film and the first lower channel film between a lower surface of the semiconductor conduction line and a lower surface of the uppermost metallic line, the upper connection channel film extending in a second direction different from the first direction; and
a first cutting line through the plurality of metallic lines and the semiconductor conduction line, the first cutting line including:
a first upper cutting line through the semiconductor conduction line, and
a first lower cutting line through the plurality of metallic lines, a width of the first upper cutting line being greater than a width of an extension line of a sidewall of the first lower cutting line on the lower surface of the semiconductor conduction line.

2. The semiconductor memory device as claimed in claim 1, wherein the first cutting line does not include a conductive material.

3. The semiconductor memory device as claimed in claim 2, wherein the first cutting line includes:
a first core cutting line penetrating the semiconductor conduction line and the plurality of metallic lines; and
a first sidewall cutting line between the first core cutting line and the semiconductor conduction line, the first sidewall cutting line not being between the first core cutting line and the plurality of metallic lines.

4. The semiconductor memory device as claimed in claim 1, wherein the first cutting line includes:
a source plug pattern penetrating the semiconductor conduction line and the plurality of metallic lines; and
a source insulating spacer extending along a sidewall of the source plug pattern.

5. The semiconductor memory device as claimed in claim 1, wherein the vertical structure further includes a vertical insulation pattern which fills a space defined by the channel film, the vertical insulation pattern being divided into two parts by the upper connection channel film.

6. The semiconductor memory device as claimed in claim 5, wherein:

the upper connection channel film includes a first upper connection channel film and a second upper connection channel film which are spaced apart from each other in the first direction, the second upper connection channel film is closer to the semiconductor conduction line than the first upper connection channel film, and the vertical insulation pattern is divided into two parts by the first upper connection channel film.

7. The semiconductor memory device as claimed in claim 1, wherein the vertical structure includes:

a lower channel insulation film between the first lower channel film and the plurality of metallic lines, the lower channel insulation film extending along the first lower channel film; and an upper channel insulation film between the upper channel film and the semiconductor conduction line, the upper channel insulation film extending along the upper channel film, and a stacked structure of the lower channel insulation film being different from a stacked structure of the upper channel insulation film.

8. The semiconductor memory device as claimed in claim 7, wherein the semiconductor conduction line is in contact with the upper channel insulation film.

9. The semiconductor memory device as claimed in claim 1, wherein the vertical structure further includes a channel insulation film that is continuous along a profile of the channel film.

10. The semiconductor memory device as claimed in claim 1, wherein the channel film further includes:

a second lower channel film extending in the first direction between the substrate and the first lower channel film; and a lower connection channel film which connects the first lower channel film and the second lower channel film and extends in the second direction.

11. The semiconductor memory device as claimed in claim 1, further comprising:

a connection pad on the vertical structure and in contact with the channel film;

a punching prevention film and an interlayer insulation film sequentially placed on the semiconductor conduction line, the punching prevention film including a material different from the interlayer insulation film, and an upper surface of the punching prevention film being on a same plane as an upper surface of the connection pad; and a connection plug which penetrates the interlayer insulation film and is connected to the connection pad.

12. A semiconductor memory device, comprising:

a stacked structure including a plurality of metallic lines stacked in a first direction on a substrate, the plurality of metallic lines including an uppermost metallic line;

a semiconductor conduction line on the uppermost metallic line of the plurality of metallic lines, the semiconductor conduction line including a semiconductor material;

a vertical structure penetrating the semiconductor conduction line and the stacked structure, and including a channel film and a vertical insulation pattern, the vertical insulation pattern filling a space defined by the channel film, and the channel film including:

an upper channel film extending in the first direction in the semiconductor conduction line, and a lower channel film extending in the first direction in the stacked structure, wherein each of the upper and lower channel films includes an outer wall facing the vertical insulation pattern, and an inner wall opposing the outer wall, and the inner wall of the upper channel film being between extension lines of the outer wall of the lower channel film which penetrates the uppermost metallic line; and a cutting line through the plurality of metallic lines and the semiconductor conduction line, the cutting line including:

an upper cutting line through the semiconductor conduction line, and a lower cutting line through the plurality of metallic lines, a width of the upper cutting line being greater than a width of an extension line of a sidewall of the lower cutting line on a lower surface of the semiconductor conduction line.

13. The semiconductor memory device as claimed in claim 12, wherein the cutting line does not include a conductive material.

14. The semiconductor memory device as claimed in claim 12, wherein the vertical insulation pattern is spatially divided into two parts by the channel film.

15. The semiconductor memory device as claimed in claim 12, wherein the vertical structure further includes:

a lower channel insulation film between the lower channel film and the plurality of metallic lines, and extends along the lower channel film; and an upper channel insulation film between the upper channel film and the semiconductor conduction line, and extends along the upper channel film, a stacked structure of the lower channel insulation film being different from a stacked structure of the upper channel insulation film.

16. A semiconductor memory device comprising:

a peripheral logic structures including a peripheral circuit on a base substrate;

a horizontal conductive substrate extending along an upper surface of the peripheral logic structure;

a stacked structure including a plurality of metallic lines stacked in a first direction on the horizontal conductive substrate, the plurality of metallic lines including an uppermost metallic line;

a semiconductor conduction line on the uppermost metallic line of the plurality of metallic lines, the semiconductor conduction line including a semiconductor material;

a vertical structure penetrating the semiconductor conduction line and the stacked structure, and including a channel film electrically connected to the horizontal conductive substrate, the channel film including:

an upper channel film and a first lower channel film extending in the first direction, and an upper connection channel film connecting the upper channel film and the first lower channel film between a lower surface of the semiconductor conduction line and a lower surface of the uppermost metallic line, the upper connection channel film extending in a second direction different from the first direction; and a first cutting line through the plurality of metallic lines and the semiconductor conduction line, the first cutting line including an insulation material, and including:

a first upper cutting line through the semiconductor conduction line, and a first lower cutting line through the plurality of metallic lines, a width of the first upper cutting line being greater than a width of an extension line of a sidewall of the first lower cutting line on the lower surface of the semiconductor conduction line.

17. The semiconductor memory device as claimed in claim 16, wherein the channel film further includes:
a second lower channel film extending in the first direction between the base substrate and the first lower channel film; and
a lower connection channel film which connects the first lower channel film and the second lower channel film and extends in the second direction.

18. The semiconductor memory device as claimed in claim 16, further comprising a vertical structure support film in contact with the channel film, between the horizontal conductive substrate and the stacked structure, the vertical structure support film electrically connecting the horizontal conductive substrate and the channel film.

19. The semiconductor memory device as claimed in claim 16, wherein the vertical structure further includes a vertical insulation pattern which fills a space defined by the channel film, the vertical insulation pattern being divided into two parts by the upper connection channel film.

20. The semiconductor memory device as claimed in claim 16, wherein the vertical structure further includes:
a lower channel insulation film between the first lower channel film and the plurality of metallic lines, the lower channel insulation film extending along the first lower channel film; and
an upper channel insulation film between the upper channel film and the semiconductor conduction line, the upper channel insulation film being in contact with the semiconductor conduction line, and stacked structure of the lower channel insulation film being different from a stacked structure of the upper channel insulation film.

* * * * *